United States Patent
Park et al.

(10) Patent No.: US 11,925,015 B2
(45) Date of Patent: Mar. 5, 2024

(54) VERTICAL MEMORY DEVICES AND METHODS OF MANUFACTURING THE SAME

(71) Applicant: Samsung Electronics Co., Ltd., Suwon-si (KR)

(72) Inventors: Sang-Yong Park, Suwon-si (KR); Kee-Jeong Rho, Hwaseong-si (KR); Hyeong Park, Hwaseong-si (KR); Tae-Wan Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/024,987

(22) Filed: Sep. 18, 2020

(65) Prior Publication Data
US 2021/0005615 A1    Jan. 7, 2021

Related U.S. Application Data

(63) Continuation of application No. 15/712,836, filed on Sep. 22, 2017, now Pat. No. 10,811,421, which is a (Continued)

(30) Foreign Application Priority Data

Jan. 14, 2015    (KR) ................... 10-2015-0006980

(51) Int. Cl.
*H10B 12/00*    (2023.01)
*H01L 23/31*    (2006.01)
(Continued)

(52) U.S. Cl.
CPC ......... *H10B 12/50* (2023.02); *H01L 23/3171* (2013.01); *H01L 23/3185* (2013.01); (Continued)

(58) Field of Classification Search
CPC ........... H01L 27/10897; H01L 23/3171; H01L 23/3185; H01L 23/528; H01L 27/11568; (Continued)

(56) References Cited

U.S. PATENT DOCUMENTS 6,638,861 B1    10/2003    Ngo
8,390,055 B2    3/2013    Higashi et al.
(Continued)

FOREIGN PATENT DOCUMENTS

CN    1582345 A    2/2005
CN    101647094 A    2/2010
(Continued)

OTHER PUBLICATIONS

Office Action dated Nov. 20, 2018 for corresponding Chinese Application No. 201610024352.X (8 pages) (no English translation).

*Primary Examiner* — Dao H Nguyen
(74) *Attorney, Agent, or Firm* — Myers Bigel, P.A.

(57) ABSTRACT

Vertical memory devices, and methods of manufacturing the same, include providing a substrate including a cell array region and a peripheral circuit region, forming a mold structure in the cell array region, forming an opening for a common source line passing through the mold structure and extending in a first direction perpendicular to a top surface of the substrate, forming a first contact plug having an inner sidewall delimiting a recessed region in the opening for the common source line, and forming a common source bit line contact electrically connected to the inner sidewall of the first contact plug.

15 Claims, 37 Drawing Sheets

Related U.S. Application Data continuation of application No. 14/965,532, filed on Dec. 10, 2015, now Pat. No. 9,780,096.

(51) Int. Cl.

| | | |
|---|---|---|
| *H01L 23/528* | (2006.01) | |
| *H01L 29/423* | (2006.01) | |
| *H01L 29/78* | (2006.01) | |
| *H01L 29/792* | (2006.01) | |
| *H10B 43/27* | (2023.01) | |
| *H10B 43/30* | (2023.01) | |
| *H10B 43/35* | (2023.01) | |
| *H10B 43/40* | (2023.01) | |
| *H10B 43/50* | (2023.01) | |

(52) U.S. Cl.
CPC ...... *H01L 23/528* (2013.01); *H01L 29/42352* (2013.01); *H01L 29/4236* (2013.01); *H01L 29/7827* (2013.01); *H01L 29/7926* (2013.01); *H10B 43/27* (2023.02); *H10B 43/30* (2023.02); *H10B 43/35* (2023.02); *H10B 43/40* (2023.02); *H10B 43/50* (2023.02); *H01L 2924/0002* (2013.01)

(58) Field of Classification Search
CPC .......... H01L 27/1157; H01L 27/11573; H01L 27/11575; H01L 27/11582; H01L 29/42352; H01L 29/4236; H01L 29/7827; H01L 29/7926; H01L 2924/0002; H01L 27/11551; H01L 29/42336; H10B 12/50; H10B 43/27; H10B 43/30; H10B 43/35; H10B 43/40; H10B 43/50; H10B 41/20
See application file for complete search history.

(56) References Cited

U.S. PATENT DOCUMENTS

| | | |
|---|---|---|
| 8,482,055 B2 | 7/2013 | Choi |
| 8,653,585 B2 | 2/2014 | Youm et al. |
| 8,730,727 B2 | 5/2014 | Yoo et al. |
| 8,766,446 B2 | 7/2014 | Kuge et al. |
| 8,803,222 B2 | 8/2014 | Lee et al. |
| 8,879,321 B2 | 11/2014 | Hwang et al. |
| 8,921,918 B2 | 12/2014 | Shim et al. |
| 9,087,861 B2 | 7/2015 | Hwang et al. |
| 2005/0032364 A1 | 2/2005 | Okubo et al. |
| 2006/0246710 A1 | 11/2006 | Cheong et al. |
| 2007/0158732 A1 | 7/2007 | Kim |
| 2008/0254617 A1 | 10/2008 | Adetutu et al. |
| 2012/0068255 A1 | 3/2012 | Lee et al. |
| 2012/0077320 A1 | 3/2012 | Shim et al. |
| 2013/0009235 A1 | 1/2013 | Yoo |
| 2013/0214344 A1 | 8/2013 | Lim et al. |
| 2013/0228928 A1* | 9/2013 | Kuge .................. H01L 27/1157 257/E21.294 |
| 2013/0330926 A1 | 12/2013 | Chandrashekar et al. |
| 2014/0061748 A1 | 3/2014 | Lee |
| 2014/0349453 A1 | 11/2014 | Lee et al. |
| 2015/0011064 A1 | 1/2015 | Hwang et al. |
| 2015/0137259 A1 | 5/2015 | Han et al. |
| 2016/0133630 A1 | 5/2016 | Kim et al. |

FOREIGN PATENT DOCUMENTS

| | | |
|---|---|---|
| CN | 102544063 A | 7/2012 |
| KR | 10-2011-0003761 | 1/2011 |
| KR | 1020110003764 | 1/2011 |
| KR | 1020120031658 A | 4/2012 |
| KR | 10-2012-0058223 A | 6/2012 |
| KR | 20130038032 A | 4/2013 |
| KR | 1020130096526 A | 8/2013 |
| KR | 1020140029703 A | 3/2014 |
| KR | 1020140093116 A | 7/2014 |

* cited by examiner

VERTICAL MEMORY DEVICES AND METHODS OF MANUFACTURING THE SAME

CROSS-REFERENCE TO RELATED APPLICATIONS

This application is a continuation of U.S. patent application Ser. No. 15/712,836, filed Sep. 22, 2017, which claims priority to U.S. patent application Ser. No. 14/965,532, filed Dec. 10, 2015, issued as U.S. Pat. No. 9,780,096, which claims the benefit of Korean Patent Application No. 10-2015-0006980, filed on Jan. 14, 2015, in the Korean Intellectual Property Office, the disclosure of which is incorporated herein in its entirety by reference.

BACKGROUND

Example embodiments of the inventive concept relate to vertical memory devices and methods of manufacturing the same, and more particularly, to vertical memory devices having a channel vertical to a top surface of a substrate, and methods of manufacturing the same.

To facilitate high integration of memory devices, extensive research has been conducted to develop vertical memory devices in which memory cells are stacked vertically to a top surface of a substrate. The vertical memory device includes a pillar-shaped or a cylindrical channel protruding vertically from a top surface of a substrate, a plurality of gate lines contacting the channel, and a common source line contact plug that separates the plurality of gate lines. The vertical memory device further includes a separation film pattern electrically insulating the gate lines from the common source line contact plug. In manufacturing the common source line contact plug in an opening for the common source line, a void may be formed in an interior of the common source line contact plug. A by-product gas that is formed in the process of forming the contact plug may be confined in the void. In a case where the separation film pattern is melted away due to the gas, an electrical short between the contact plug and the gate lines may occur. In addition, a top surface of the contact plug may swell in a direction perpendicular to the top surface of the substrate by the gas confined in the void.

SUMMARY

Some example embodiments of the inventive concept provide vertical memory devices having improved reliability.

Other example embodiments of the inventive concept provide methods of manufacturing a vertical memory device having improved reliability.

According to some example embodiments of the inventive concept, there is provided a method of manufacturing a vertical memory device, including providing a substrate including a cell array region and a peripheral circuit region, forming a mold structure in the cell array region, forming an opening for a common source line passing through the mold structure and extending in a first direction perpendicular to a top surface of the substrate, forming a first contact plug having an inner sidewall delimiting a recessed region in the opening for the common source line, and forming a common source bit line contact electrically connected to the inner sidewall of the first contact plug.

The forming the first contact plug may be performed such that the first contact plug includes an open passage of the recessed region in the vicinity of an entrance of the opening for the common source line, and the method may further include, after forming the first contact plug, exhausting a gas in the recessed region outside the recessed region through the open passage.

The forming an opening for a common source line may be performed such that the opening for the common source line extends in a second direction perpendicular to the first direction, and the forming the first contact plug is performed such that the first contact plug extends in the second direction.

The method may further include, after exhausting the gas in the recessed region: forming a buried film pattern extending in the second direction in the recessed region, exposing a portion of the inner sidewall of the first contact plug in the recessed region by partially removing the buried film pattern, and forming a second contact plug contacting the exposed inner sidewall in the recessed region and extending in the second direction on the buried film pattern, and the forming a common source bit line contact may further include: forming an upper insulating film on the substrate, and forming the common source bit line contact passing through the upper insulating film and electrically connected to the first contact plug and the second contact plug.

The forming the second contact plug may be performed such that the second contact plug contacts the inner sidewall of the first contact plug and a top surface of the buried film pattern and has a top surface thereof positioned on substantially the same plane as a top surface of the first contact plug, the forming the common source bit line contact may be performed such that the common source bit line contact is in contact with the first contact plug and the second contact plug, and the method may further include, after forming the common source bit line contact, forming a common source bit line electrically connected to the common source bit line contact.

The method may further include, after exhausting the gas in the recessed region: forming a barrier film pattern extending in the second direction on the first contact plug in the recessed region, and forming a second contact plug extending in the second direction on the barrier film pattern, and the forming a common source bit line contact may further include: forming an upper insulating film on the substrate, and forming the common source bit line contact passing through the upper insulating film and electrically connected to the first contact plug and the second contact plug.

The forming the common source bit line contact may be performed such that the common source bit line contact is in contact with respective top surfaces of the first contact plug, the barrier film pattern, and the second contact plug, and the method may further include, after forming the common source bit line contact, forming a common source bit line electrically connected to the common source bit line contact.

The method may further include, after exhausting the gas in the recessed region, forming a buried film pattern extending in the second direction in the recessed region, and the forming the common source bit line contact may further include: forming an upper insulating film on the substrate, forming a contact hole exposing a portion of the inner sidewall of the first contact plug by partially removing the upper insulating film and the buried film pattern, and forming the common source bit line contact in the contact hole to electrically contact the first contact plug.

The forming the common source bit line contact may be performed such that the common source bit line contact is in contact with a top surface and the inner sidewall of the first contact plug and a top surface of the buried film pattern, and the method may further include, after forming the common source bit line contact, forming a common source bit line electrically connected to the common source bit line contact.

The forming the mold structure may include forming a plurality of interlayer insulating films and a plurality of sacrificial films alternately stacked in the cell array region along the first direction, and the method may further include, after forming the mold structure: forming a mold protection film contacting the mold structure in a portion of the cell array region and in the peripheral circuit region, forming a plurality of vertical channel structures passing through the mold structure and extending in the first direction, and forming a plurality of interlayer insulating film patterns and a plurality of sacrificial film patterns by forming the opening for the common source line passing through the plurality of interlayer insulating films and the plurality of sacrificial films along the first direction, and the method may further include, after forming the opening for the common source line, prior to forming the first contact plug: forming space regions between the respective interlayer insulating film patterns by removing the plurality of sacrificial film patterns exposed through the opening for the common source line, and forming a plurality of cell gate lines in the space regions to surround the plurality of vertical channel structures.

The method may further include, after forming the plurality of cell gate lines, prior to forming the first contact plug, forming a separation film pattern on sidewalls of the opening for the common source line to cover respective sidewalls of the plurality of cell gate lines.

The method may further include, after forming the plurality of cell gate lines: forming a plurality of cell gate line contact holes passing through the mold protection film and the plurality of interlayer insulating film patterns of the cell array region and extending in the first direction to expose the plurality of cell gate lines, forming a peripheral circuit contact hole passing through the mold protection film of the peripheral circuit region and extending in the first direction, and forming a plurality of third contact plugs disposed in the respective cell gate line contact holes and a fourth contact plug disposed in the peripheral circuit contact hole, the plurality of third contact plugs and the fourth contact plug are formed at substantially a same time as the first contact plug.

The forming the opening for the common source line may further include: forming an insulative capping film on the mold structure in which the plurality of vertical channel structures are formed and the mold protection film, and forming the opening for the common source line passing through the insulative capping film and the mold structure and extending in the first direction, and the forming the first contact plug may be performed such that an outer sidewall of the first contact plug includes a first part facing the plurality of cell gate lines and a second part facing the insulative capping film.

The method may further include: forming an upper insulating film covering the first contact plug on the insulative capping film, forming a plurality of cell gate line contact holes passing through the upper insulating film, the insulative capping film, the mold protection film, and the plurality of interlayer insulating films of the cell array region and exposing the plurality of cell gate lines, forming a peripheral circuit contact hole passing through the upper insulating film, the insulative capping film, and the mold protection film of the peripheral circuit region and extending in the first direction, and simultaneously forming a plurality of third contact plugs disposed in the respective cell gate line contact holes and a fourth contact plug disposed in the peripheral circuit contact hole.

The method may further include: forming a cell bit line electrically connected to the vertical channel structure, forming a common source bit line contact electrically connected to the first contact plug, forming a common source bit line electrically connected to the common source bit line contact, and forming a connection wiring electrically connected to the plurality of third contact plugs and the fourth contact plug, a top surface of the connection wiring being positioned on substantially a same plane as a top surface of the cell bit line and a top surface of the common source bit line.

The exhausting the gas in the recessed region may be performed through a heat treatment process or a vacuum pumping process.

According to other example embodiments of the inventive concept, there is provided a vertical memory device including: a substrate including a cell array region and a peripheral circuit region, a cell gate stack structure in which a plurality of vertical channel structures are formed, the cell gate stack structure disposed in the cell array region and the plurality of vertical channel structures extending in a first direction perpendicular to a top surface of the substrate, and a first common source line contact plug passing through the cell gate stack structure between at least two of the vertical channel structures and extending in the first direction and in a second direction perpendicular to the first direction, the first common source line contact plug having an inner sidewall delimiting a recessed region.

The vertical memory device may further include: a common source bit line, and the first common source line contact plug including a lower portion electrically connected to the substrate and an upper portion electrically connected to the common source bit line.

The vertical memory device may further include: a buried film pattern extending in the second direction in the recessed region, and a common source bit line contact in contact with the inner sidewall of the first common source line contact plug, disposed on the buried film pattern, and electrically connected to the common source bit line.

The common source bit line contact may include a first portion disposed outside the recessed region and contacting a top surface of the first common source line contact plug and a second portion disposed inside the recessed region and contacting the inner sidewall of the first common source line contact plug and a top surface of the buried film pattern, and a width of the first portion is greater than a width of the second portion.

The vertical memory device may further include: a buried film pattern extending in the second direction in the recessed region, a second common source line contact plug in contact with the inner sidewall of the first common source line contact plug and extending in the second direction on the buried film pattern, and a common source bit line contact disposed on the first and second common source line contact plugs and electrically connected to the common source bit line.

A top surface of the first common source line contact plug may be positioned on substantially a same plane as a top surface of the second common source line contact plug.

The vertical memory device may further include: a barrier film pattern disposed on the first common source line contact plug in the recessed region and extending in the second direction, a second common source line contact plug disposed on the barrier film pattern in the recessed region and extending in the second direction, and a common source bit line contact disposed on the first and second common source line contact plugs and electrically connected to the common source bit line.

Respective top surfaces of the barrier film pattern, the first common source line contact plug, and the second common source line contact plug may be positioned on substantially a same plane.

The vertical memory device may further include: a buried film pattern disposed in the recessed region and including an insulating material.

The cell gate stack structure may include a plurality of interlayer insulating film patterns spaced apart from each other along the first direction on the substrate and a plurality of cell gate lines disposed between the respective interlayer insulating film patterns and surrounding the plurality of vertical channel structures, and the vertical memory device may further include a mold protection film contacting the cell gate stack structure in a portion of the cell array region and in the peripheral circuit region.

The vertical memory device may further include a separation film pattern disposed between the plurality of cell gate lines and the first common source line contact plug and covering respective sidewalls of the plurality of cell gate lines.

The vertical memory device may further include: a plurality of cell gate line contact plugs passing through the mold protection film and the plurality of interlayer insulating film patterns in the cell array region and connected to the respective cell gate lines, and a peripheral circuit contact plug passing through the mold protection film in the peripheral circuit region and extending in the first direction, and respective top surfaces of the first common source line contact plug, the plurality of cell gate line contact plugs, and the peripheral circuit contact plugs are positioned on substantially a same plane.

The vertical memory device may further include: an insulative capping film disposed on the cell gate stack structure and the mold protection film, an upper insulating film disposed on the insulative capping film, a plurality of cell gate line contact plugs passing through the upper insulating film, the insulative capping film, the mold protection film, and the plurality of interlayer insulating patterns in the cell array region and connected to the respective cell gate lines, and a peripheral circuit contact plug passing through the upper insulating film, the insulative capping film, and the mold protection film in the peripheral circuit region and extending in the first direction, and the first common source line contact plug may include a first part facing the plurality of cell gate lines and a second part facing the insulative capping film.

A top surface of the first common source line contact plug may be positioned on substantially a same plane as a top surface of the insulative capping film, and respective top surfaces of the plurality of cell gate line contact plugs and the peripheral circuit contact plug may be positioned on substantially a same plane.

The vertical memory device may further include: a cell bit line electrically connected to at least one of the plurality of vertical channel structures, a common source bit line electrically connected to the first common source line contact plug, and a connection wiring electrically connected to the peripheral circuit contact plug and at least one of the plurality of cell gate line contact plugs, and respective top surfaces of the cell bit line, the common source bit line, and the connection wiring may be positioned on substantially a same plane.

According to still other example embodiments of the inventive concept, there is provided a vertical memory device including: a substrate including a cell array region and a peripheral circuit region, a cell gate stack structure in the cell array region, a common source line contact plug passing through the cell gate stack structure and having an inner sidewall delimiting a recessed region, and a common source bit line contact electrically connected to the inner sidewall of the common source line contact plug.

According to further example embodiments of the inventive concept, there is provided a memory device including: a plurality of vertical memory devices, each of which includes a plurality of memory transistors connected in series and vertically stacked, and a controller configured to control the vertical memory devices, and each of the vertical memory devices may include: a substrate including a cell array region and a peripheral circuit region, a cell gate stack structure disposed in the cell array region and in which an opening for a common source line is formed to extend in a first direction perpendicular to a top surface of the substrate and in a second direction perpendicular to the first direction, and a first common source line contact plug formed in the opening for the common source line and having an inner sidewall delimiting a recessed region in the opening for the common source line.

According to further example embodiments of the inventive concept, there is provided an electronic system including: a memory including a plurality of vertical memory devices, each of which includes a plurality of memory transistors connected in series and vertically stacked, a processor configured to communicate with the memory through a bus, and a input/output device configured to communicate with the bus, and each of the vertical memory devices may include: a substrate including a cell array region and a peripheral circuit region, a cell gate stack structure disposed in the cell array region and in which an opening for a common source line is formed to extend in a first direction perpendicular to a top surface of the substrate and in a second direction perpendicular to the first direction, and a first common source line contact plug formed in the opening for the common source line and having an inner sidewall delimiting a recessed region in the opening for the common source line.

Other methods, systems, and/or devices according to embodiments of the inventive subject matter will be or become apparent to one with skill in the art upon review of the following drawings and detailed description. It is intended that all such additional methods, systems, and/or devices be included within this description, be within the scope of the present inventive concepts, and be protected by the accompanying claims. Moreover, it is intended that all embodiments disclosed herein can be implemented separately or combined in any way and/or combination.

BRIEF DESCRIPTION OF THE DRAWINGS

Exemplary embodiments of the inventive concept will be more clearly understood from the following detailed description taken in conjunction with the accompanying drawings. FIGS. 1 through 16 represent non-limiting, example embodiments as described herein.

FIG. 1 is an equivalent circuit diagram of a cell array of a vertical memory device, according to example embodiments of the inventive concept;

FIG. 2 is a plan view illustrating a vertical memory device, according to example embodiments of the inventive concept;

FIG. 3A is an exemplary cross-sectional view taken along the line A1-A2 of FIG. 2, FIG. 3B is an exemplary cross-sectional view taken along the line B1-B2 of FIG. 2, and FIG. 3C is an exemplary cross-sectional view taken along the line C1-C2 of FIG. 2;

FIGS. 8A to 14C are cross-sectional views illustrating a method of manufacturing a vertical memory device of FIGS. 2, 3A, 3B, 4A, 4B, 5A, 5B, 6A, and 6B, according to further example embodiments of the inventive concept, FIGS. 8A, 9A, . . . , and 14A are cross-sectional views taken along the line A1-A2 of FIG. 2, FIGS. 8B, 9B, . . . , and 14B are cross-sectional views taken along the line B1-B2 of FIG. 2, and FIGS. 8C, 9C, . . . , and 14C are cross-sectional views taken along the line C1-C2 of FIG. 2;

FIG. 15 is a schematic block diagram of a vertical memory device according to example embodiments of the inventive concept; and FIG. 16 is a block diagram illustrating a schematic configuration of an electronic system, according to example embodiments of the inventive concept.

DETAILED DESCRIPTION OF EXAMPLE EMBODIMENTS

Figure 1:
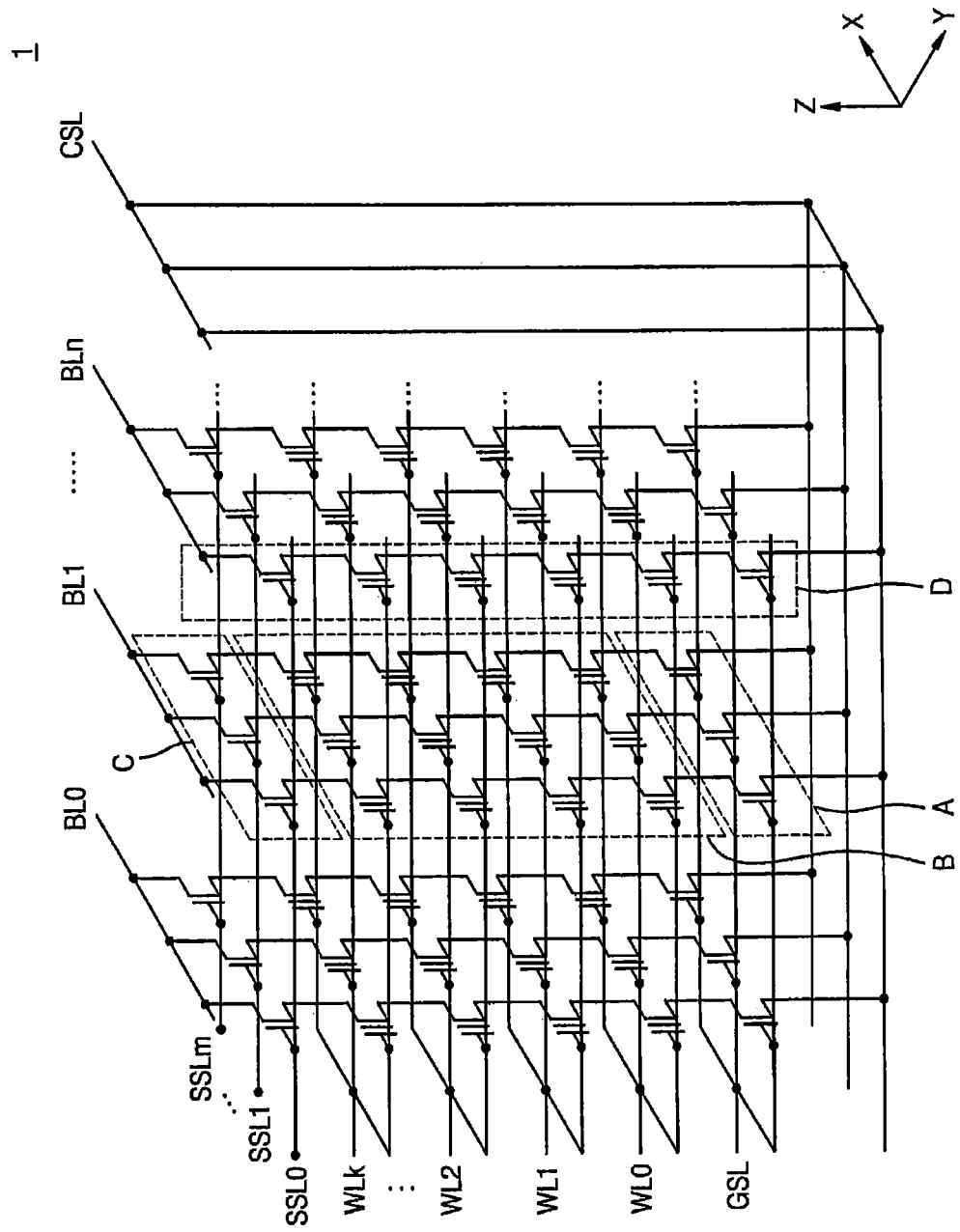

Hereinafter, embodiments of the inventive concept will be described with reference to the accompanying drawings. The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. It should be understood, however, that there is no intent to limit the inventive concept to the particular forms disclosed, but on the contrary, the inventive concept is to cover all modifications, equivalents, and alternatives falling within the spirit and scope of the inventive concept. Like reference numerals denote like elements throughout the specification and drawings. In the drawings, the dimensions of structures are exaggerated or reduced for clarity of the inventive concept.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Also, though terms "first" and "second" are used to describe various members, components, regions, layers, and/or portions in various embodiments of the inventive concept, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Unless otherwise defined, all terms used herein, including technical and scientific terms, have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Example embodiments of the inventive concept will be described in detail with reference to the accompanying drawings.

Figure 2:
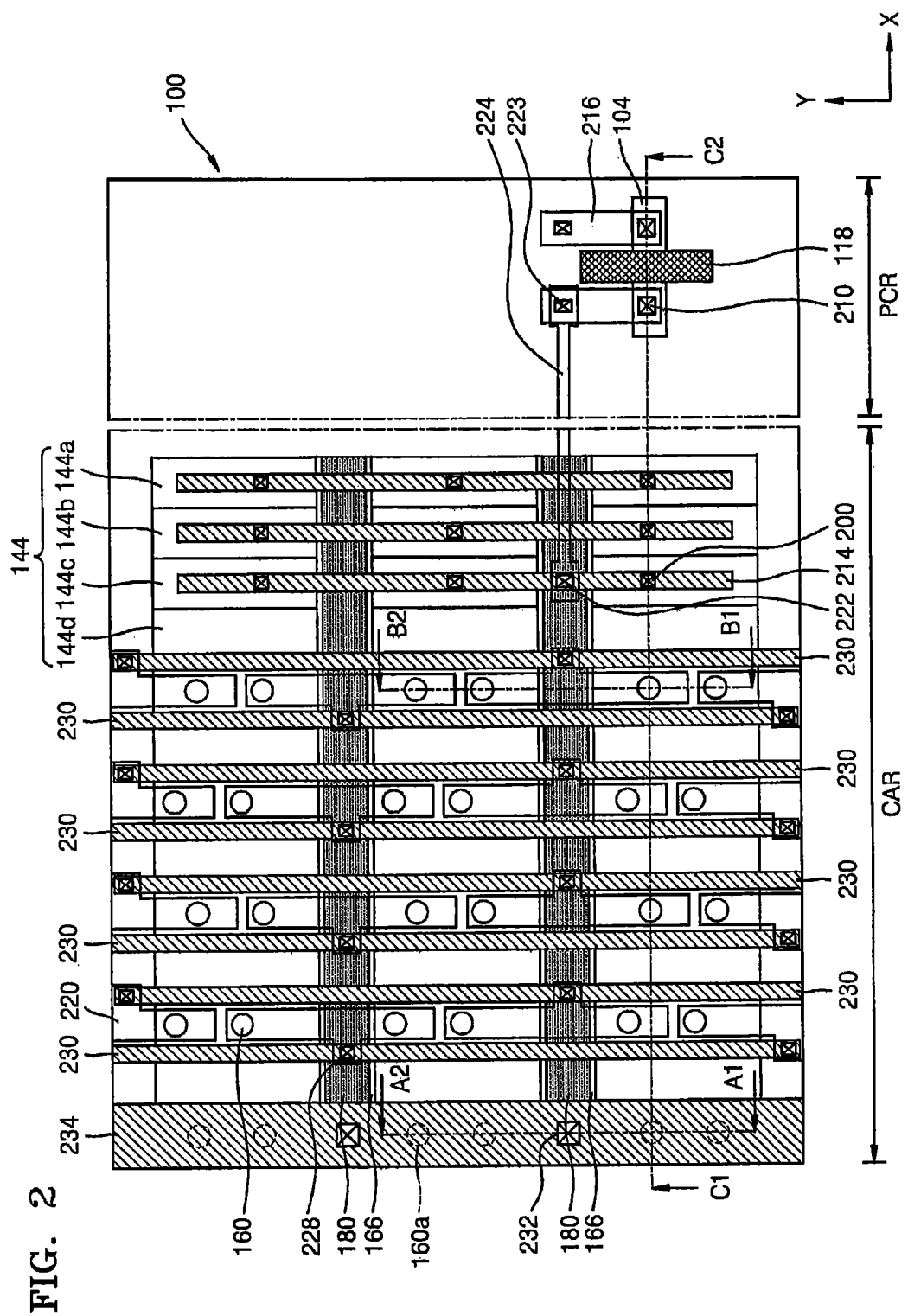

FIG. 1 is an equivalent circuit diagram illustrating a three-dimensional configuration of a memory cell array included in a vertical memory device, according to example embodiments of the inventive concept, and FIG. 2 is a plan view illustrating a vertical memory device, according to example embodiments of the inventive concept. The vertical memory device may be a non-volatile NAND flash memory device having a vertically stacked structure.

Referring to FIG. 2 in conjunction with FIG. 1, a cell bit lines 230 may correspond to elements depicted by reference numerals BL0, BL1, . . . , BLn of FIG. 1, a common source bit line 234 may correspond to a common source line CSL of FIG. 1. A cell gate line structure 144 may include ground selection transistors A controlled by a ground selection line GSL, memory transistors B controlled by word lines WL0, WL1, WL2, . . . , WLk, and string selection transistors C controlled by string selection lines SSL0, SSL1, . . . , SSLm. The ground selection transistor A, the memory transistors B, and the string selection transistors C that are vertically stacked along the Z direction may constitute a cell string D. The plurality of memory transistors B may be connected in series. The memory transistors B connected in series may be vertically arranged. Each of the bit lines BL0, BL1, . . . , BLn may connect a plurality of cell strings D with each other in a parallel manner. In FIG. 1, parameters m, n, and k are integers.

Figure 3A:
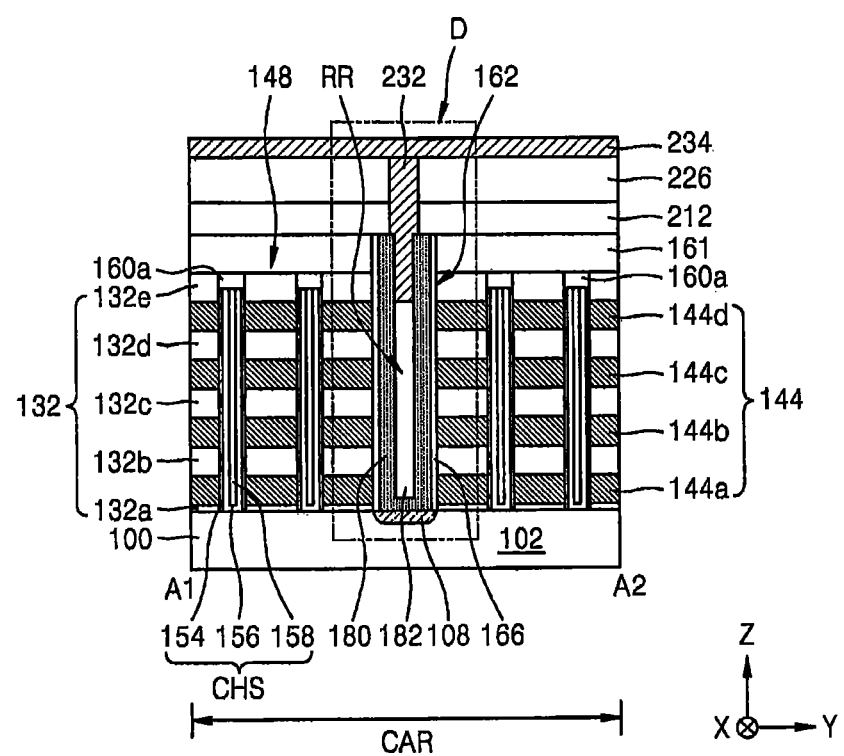
FIGS. 3A, 3B, and 3C are views of a vertical memory device, according to example embodiments of the inventive concept.
Figure 3B:
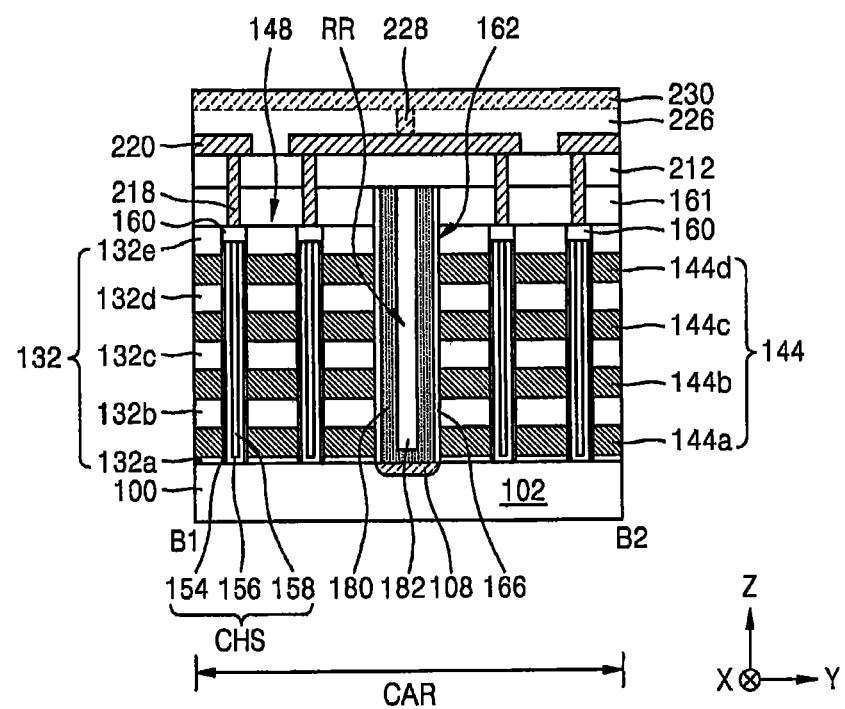
Figure 3C:
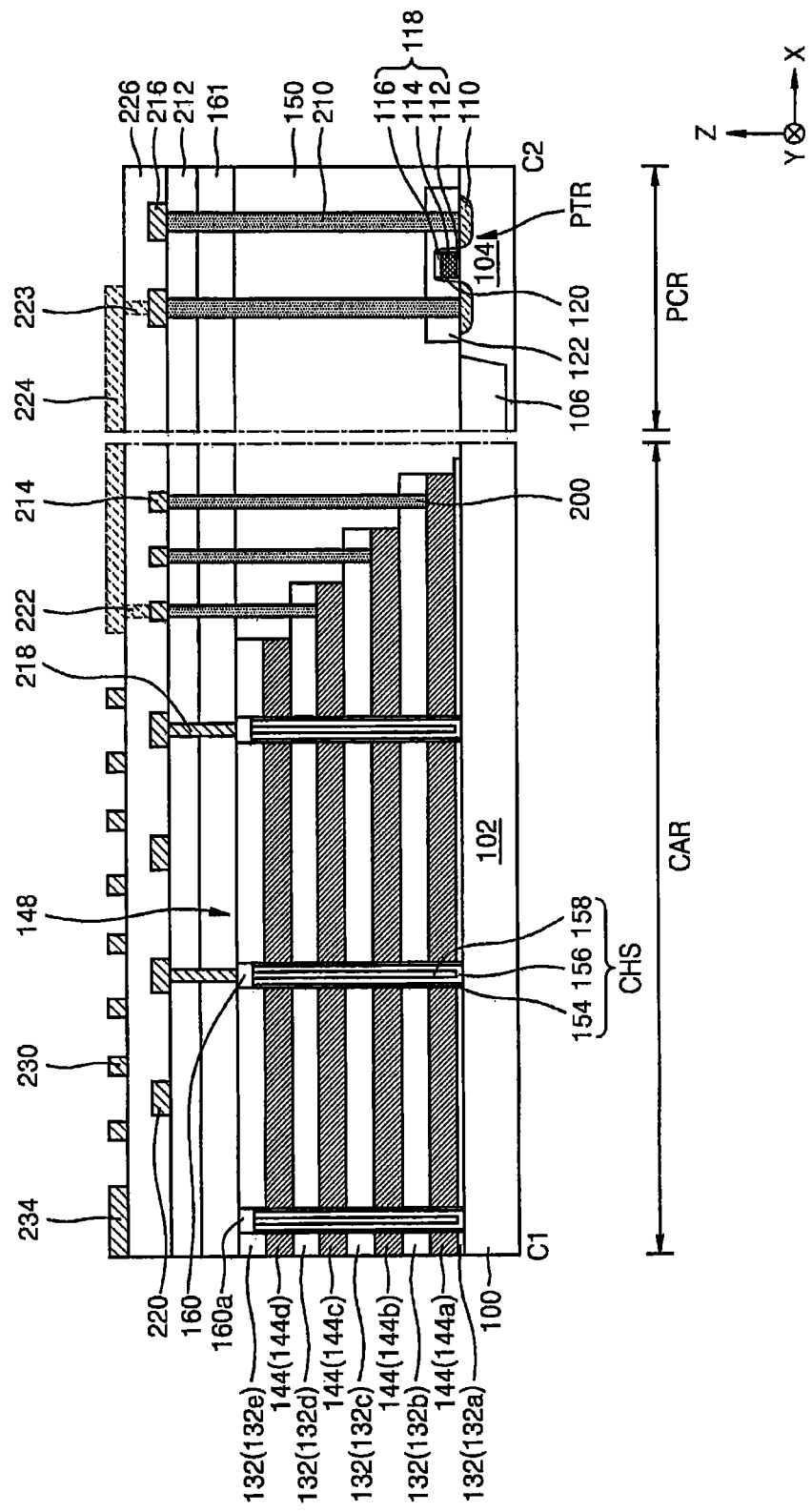

FIGS. 3A, 3B, and 3C are views of a vertical memory device, according to some example embodiments of the inventive concept, FIG. 3A is an exemplary cross-sectional view taken along the line A1-A2 of FIG. 2, FIG. 3B is an exemplary cross-sectional view taken along the line B1-B2 of FIG. 2, and 3C is an exemplary cross-sectional view taken along the line C1-C2 of FIG. 2.

In FIGS. 2, 3A, 3B, and 3C, a first direction (Z direction) is defined as a direction substantially vertical to a top surface of a substrate 100, and a second direction (X direction) and a third direction (Y direction) are respectively defined as two directions parallel to the top surface of the substrate 100 and intersecting with each other. For example, the second direction and the third direction may intersect substantially perpendicular to each other. The second direction and the third direction may be substantially perpendicular to the first direction. The directions indicated by arrows on the drawings and opposite directions thereto are described as the same directions. The definitions of the above-described directions will be equally applied to all the accompanying drawings.

Referring to FIGS. 2, 3A, 3B, and 3C, the substrate 100 may include, for example, a semiconductor material, such as silicon or germanium. The substrate 100 may function as a p-type well of the vertical memory device. The substrate 100 may include a cell array region CAR and a peripheral circuit region PCR. The substrate 100 may include a device isolation region 106 delimiting active areas 102 and 104. The active areas 102 and 104 may include a first active area 102 delimited in the cell array region CAR, and a second active area 104 delimited in the peripheral circuit region PCR.

The vertical memory device may include a plurality of cell gate stack structures 148 formed on the first active area 102 of the cell array region CAR. The respective cell gate stack structures 148 may include a plurality of interlayer insulating film patterns 132 (132a, 132b, 132c, 132d, and 132e) extending in the second direction (X direction) and formed to be spaced apart from each other along the first direction (Z direction) and a plurality of cell gate lines 144 (144a, 144b, 144c, 144d) disposed between the respective interlayer insulating film patterns 132 (132a, 132b, 132c, 132d, 132e). The cell gate lines 144 (144a, 144b, 144c, 144d) may extend in the second direction (X direction) on the substrate 100 and be spaced apart from one another in the first direction (Z direction) from the substrate 100.

The lowermost interlayer insulating film pattern 132a may be disposed between the lowermost cell gate line 144a and the substrate 100, and the uppermost interlayer insulating film pattern 132e may be disposed on the uppermost cell gate line 144d.

The lowermost cell gate line 144a may be provided as the ground selection line GSL illustrated in FIG. 1, and the uppermost cell gate line 144d may be provided as the string selection line SSL (SSL0, SSL1, . . . , SSLm) illustrated in FIG. 1. The cell gate lines 144b and 144c, which are disposed between the ground selection line GSL and the string selection line SSL, may be provided as word lines WL (WL0, WL1, WL2, . . . , WLk).

Even though one ground selection line GSL, two word lines WL, and one string selection line SSL are illustrated, the numbers of those are not limited thereto. For example, one or more of the ground selection line GSL and one or more of the string selection line SSL may be included, and $2^n$ word lines WL, for example, four, eight, or sixteen word lines WL may be included. The number of stacking of the cell gate lines 144a, 144b, 144c, and 144d that are stacked may be determined in consideration of circuit design and/or integration degree of the vertical memory device.

Each of the cell gate lines 144a, 144b, 144c, and 144d may include a metal or a conductive metal nitride. For example, each of the cell gate lines 144a, 144b, 144c, and 144d may include a metal and/or a metal nitride having a relatively low electrical resistance, such as tungsten, tungsten nitride, titanium, titanium nitride, tantalum, tantalum nitride, or platinum. Each of the cell gate lines 144a, 144b, 144c, and 144d may have a multi-layered structure of a barrier film including a conductive metal nitride and a metal film.

The interlayer insulating film patterns 132a, 132b, 132c, 132d, and 132e may include an oxide-based material, such as silicon oxide ($SiO_2$), silicon oxycarbide (SiOC), or fluorinated silicon oxide (SiOF). The cell gate lines 144 may be insulated from one another by the interlayer insulating film patterns 132a, 132b, 132c, 132d, and 132e.

As illustrated in FIGS. 3A, 3B, and 3C, the cell gate lines 144a, 144b, 144c, and 144d and the interlayer insulating film patterns 132a, 132b, 132c, 132d, and 132e may be stacked, such that a length or a width thereof is gradually reduced in the second direction (X direction) as away from the top surface of the substrate 100 in the first direction (Z direction). For example, the cell gate lines 144a, 144b, 144c, and 144d and the interlayer insulating film patterns 132a, 132b, 132c, 132d, and 132e may be stacked in a pyramid shape or a step shape in the first direction (Z direction). Accordingly, the cell gate stack structure 148 including the cell gate lines 144a, 144b, 144c, and 144d and the interlayer insulation film patterns 132a, 132b, 132c, 132d, and 132e may be a step-shaped stack structure.

Referring to FIGS. 2, 3A, 3B, and 3C, the vertical memory device may include a plurality of vertical channel structures CHS protruding and extending from the top surface of the substrate 100 in the first direction (Z direction).

Each of the vertical channel structures CHS may include a channel 156, a dielectric film structure 154 surrounding an outer sidewall of the channel 156, and a channel buried film pattern 158 disposed within the channel 156.

The outer sidewall of the dielectric film structure 154 may be surrounded by the plurality of cell gate lines 144a, 144b, 144c, and 144d. The cell gate lines 144a, 144b, 144c, and 144d may be formed on the outer sidewall of the dielectric film structure 154 and be stacked to be spaced apart from each other in the first direction (Z direction). Each of the cell gate lines 144a, 144b, 144c, and 144d may extend in the second direction (X direction) while partially surrounding the channels 156.

The channels 156 may be formed in the cell array region CAR and be in contact with the top surface of the substrate 100. The channels 156 may have a hollow cylinder shape or a cup shape. The channels 156 may include polysilicon or single-crystal silicon and may include a p-type impurity, for example, boron (B).

A channel buried film pattern 158 may be formed in an inner space of the channel 156. The channel buried film pattern 158 may have a pillar shape or a cylinder shape, the inside of which is fully filled. The channel buried film pattern 158 may include an insulating material, such as silicon oxide. In a case where the channels 156 have a pillar shape or a cylinder, the inside of which is fully filled, the channel buried film pattern 158 may not be formed.

Although not illustrated, the dielectric film structure 154 may include a tunnel insulating film, a charge storage film, and a blocking film, which are sequentially stacked from the outer sidewall of the channels 156. The blocking film may include a silicon oxide and/or a metal oxide such as hafnium oxide, or aluminium oxide. The charge storage film may include a nitride, such as silicon nitride, and/or a metal oxide, and the tunnel insulating film may include an oxide, such as silicon oxide. For example, the stack structure including the blocking film, the charge storage film, and the tunnel insulating film may have an oxide-nitride-oxide (ONO) structure in which an oxide film, a nitride, and an oxide film are sequentially stacked.

A semiconductor pattern (not illustrated) may be further formed between the top surface of the substrate 100 and a bottom surface of the channel 156.

In this case, the channel 156 may be provided on a top surface of the semiconductor pattern, and the dielectric film structure 154 may be provided on a peripheral portion of the top surface of the semiconductor pattern. The semiconductor pattern may include, for example, single-crystalline silicon or polysilicon.

On the other hand, in a case where the semiconductor pattern is disposed between the channel 156 and the substrate 100, the lowermost cell gate line 144a capable of functioning as the ground selection line GSL may extend while surrounding an outer sidewall of the semiconductor pattern. In this case, a gate insulating film (not illustrated) may be further formed between the cell gate line 144a and the outer sidewall of the semiconductor pattern.

A pad 160 and 160a may be formed on the dielectric film structure 154, the channel 156, and the channel buried film pattern 158. The pad 160 and 160a may cover the dielectric film structure 154, the channel 156, and the channel buried film pattern 158. The pad 160 and 160a may include polysilicon or single-crystalline silicon and may further include an n-type impurity, for example, phosphorus (P) or arsenic (As). The pad 160 may be electrically connected to the cell bit line 230. The pad 160a may be disposed so as to vertically overlap with the common source bit line 234. Accordingly, the pad 160a may not be electrically connected to the cell bit line 230.

As illustrated in FIG. 2, a plurality of pads 160 and 160a may be arranged in the second direction (X direction) and the third direction (Y direction) in the cell array region CAR. Accordingly, in response to the arrangement of the pads 160 and 160a, the plurality of vertical channel structures CHS each including the channel 156, the dielectric film structure 154, and the channel buried film pattern 158 may be arranged in the second direction (X direction) and the third direction (Y direction).

Referring to FIGS. 2, 3A, 3B, and 3C, the vertical memory device may include a first common source line contact plug 180 that passes through the cell gate stack structure 148 and an insulative capping film 161 formed on the cell gate stack structure 148 and extends in the first direction (Z direction) perpendicular to the top surface of the substrate 100. The first common source line contact plug 180 may have a line shape extending in the second direction (X direction). For example, the first common source line contact plug 180 may be disposed between at least two vertical channel structures CHS.

The first common source line contact plug 180 may be formed in an opening for a common source line 162 that passes through the insulative capping film 161 and the cell gate stack structure 148 and extends in the first direction (Z direction) and the second direction (X direction) perpendicular to the first direction. The first common source line contact plug 180 may have an outer sidewall covering a bottom surface and a sidewall of the opening for the common source line 162 and an inner sidewall 180i (see FIG. 4A) delimiting a recessed region RR in the opening for the common source line 162. A vertical cross-sectional shape of the first common source line contact plug 180 cut along the third direction (Y direction) may be a U-shape. The outer sidewall of the first common source line contact plug 180 may include a first part facing to the cell gate stack structure 148 and a second part facing to the insulative capping film 161.

Two cell gate stack structures 148 may be spaced apart from each other, with the first common source line contact plug 180 being disposed therebetween. Each of the cell gate stack structures 148 may include a cell gate line structure 144. The cell gate line structure 144 may extend in the second direction (X direction) and may include the plurality of cell gate lines 144a, 144b, 144c, and 144d. In addition, each of the cell gate stack structures 148 may include an interlayer insulating film pattern structure 132. The interlayer insulating film pattern structure 132 may extend in the second direction (X direction) and may include the plurality of interlayer insulating film patterns 132a, 132b, 132c, 132d, and 132e.

As illustrated in FIGS. 3A and 3B, a separation film pattern 166 that extends in the second direction (X direction) may be formed between the cell gate line structures 144 adjacent to each other in the third direction (Y direction). A plurality of separation film patterns 166 may cover respective sidewalls of the plurality of cell gate lines 144a, 144b, 144c, and 144d and may be arranged along the third direction (Y direction). Accordingly, the separation film patterns 166 may electrically insulate the cell gate lines 144a, 144b, 144c, and 144d from the first common source line contact plug 180. In this case, the first common source line contact plug 180 and the separation film patterns 166 may extend in the second direction (X direction) and function as cell gate line cut patterns.

A top surface of the first common source line contact plug 180 may be positioned on substantially the same plane as respective top surfaces of the insulative capping film 161 and/or the separation film pattern 166.

The first common source line contact plug 180 may include a metal, a conductive metal nitride, doped polysilicon, and combinations thereof. For example, the metal may include tungsten (W).

The separation film pattern 166 may include an insulating material, such as silicon oxide.

As illustrated in FIGS. 3A and 3B, a first impurity region 108 may be formed at an upper portion of the first active area 102 of the substrate 100 adjacent to the first common source line contact plug 180. The first impurity region 108 may extend in the second direction (X direction) and may be provided as the common source line CSL of the vertical memory device. The first impurity region 108 may include an n-type impurity, for example, phosphorus (P) or arsenic (As).

Although not illustrated, a metal silicide pattern, such as a cobalt silicide pattern or a nickel silicide pattern, may be formed on the first impurity region 108, thereby reducing a contact resistance between the first common source line contact plug 180 and the first impurity region 108.

A lower portion of the first common source line contact plug 180 may be electrically connected to the first impurity region 108 and an upper portion thereof may be electrically connected to the common source bit line 234. A common source line buried film pattern 182 may be formed in the recessed region RR. The common source line buried film pattern 182 may include an insulating material, such as silicon oxide. A first upper insulating film 212 and a second upper insulating film 226 may be sequentially formed on the insulative capping film 161. A common source bit line contact 232 may pass through the second upper insulating film 226 and the first upper insulating film 212 and may be electrically connected to the first common source line contact plug 180 and the common source bit line 234.

Figure 4A:
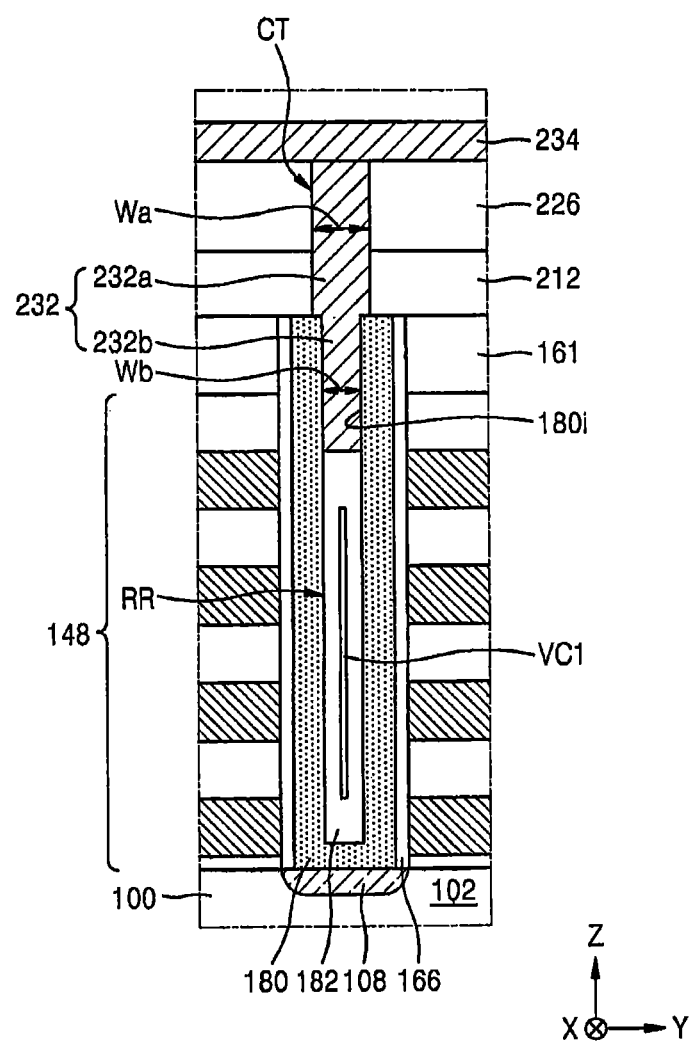
FIG. 4A is an enlarged view of a portion D of FIG. 3A.
Figure 4B:
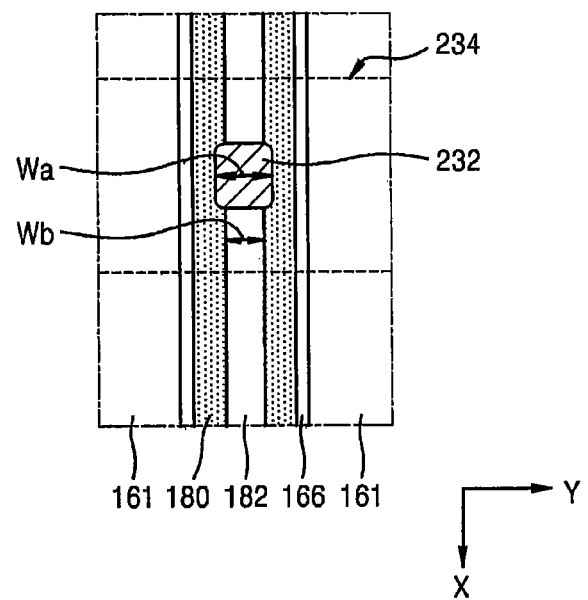
FIG. 4B is a plan view of parts of FIG. 4A.

FIG. 4A is an enlarged view of a portion D of FIG. 3A, and FIG. 4B is a plan view of parts of FIG. 4A.

Referring to FIGS. 4A and 4B, the common source line buried film pattern 182 may be formed to extend in the second direction (X direction) in the recessed region RR. The common source line buried film pattern 182 may include a void VC1 therein. The void VC1 may be formed to be spaced apart from the inner sidewall 180i of the first common source line contact plug 180.

The common source bit line contact 232 may include a first portion 232a that is disposed outside the recessed region RR and is in contact with the top surface of the first common source line contact plug 180 and a second portion 232b that is disposed in the recessed region RR and is in contact with the inner sidewall 180i of the first common source line contact plug 180 and a top surface of the common source line buried film pattern 182. The first portion 232a and the second portion 232b may be integrally connected to each other. When viewed from the third direction (Y direction), a width Wa of the first portion 232a may be greater than a width Wb of the second portion 232b. The common source bit line contact 232 may be disposed in the common source bit line contact hole CT that is formed to partially expose the inner sidewall 180i of the first common source line contact plug 180 by partially removing the second upper insulating film 226, the first upper insulating film 212, and the common source line buried film pattern 182.

In the case where the common source bit line contact 232 is in contact with the inner sidewall 180i of the first common source line contact plug 180, a contact area between the common source bit line contact 232 and the first common source line contact plug 180 is increased as compared with the case where the common source bit line contact 232 is in contact with the top surface of the first common source line contact plug 180. Accordingly, a contact resistance therebetween may be reduced.

As illustrated in FIG. 4B, the separation film pattern 166, the first common source line contact plug 180, and the common source line buried film pattern 182 may be a line shape extending in the second direction (X direction), and the common source bit line 234 shown by dashed lines in FIG. 4B may be a line shape extending the third direction (Y direction) perpendicular to the second direction (X direction). A top surface of the common source line buried film pattern 182 around the common source bit line contact hole CT may be positioned on substantially the same plane as respective top surfaces of the separation film pattern 166, the first common source line contact plug 180, and/or the insulative capping film 161. A top surface of the common source line buried film pattern 182 just below the common source line contact hole CT may be positioned at a distance closer to the substrate 100 than respective top surfaces of the separation film pattern 166, the first common source line contact plug 180, and/or the insulative capping film 161.

Figure 5A:
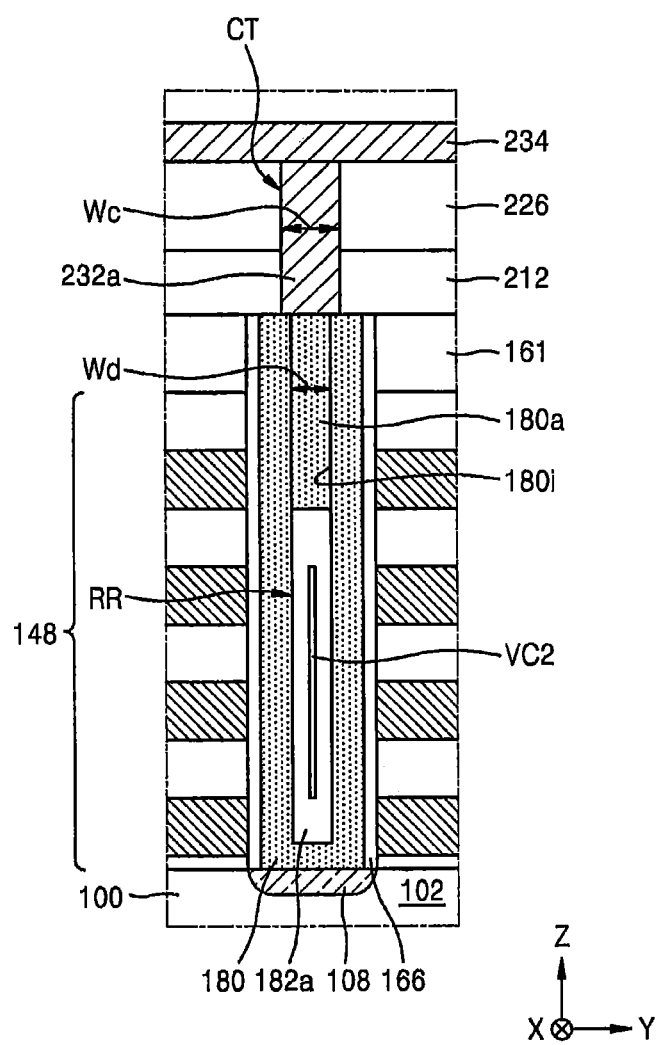
FIG. 5A is a cross-sectional view of a vertical memory device, according to other example embodiments.
Figure 5B:
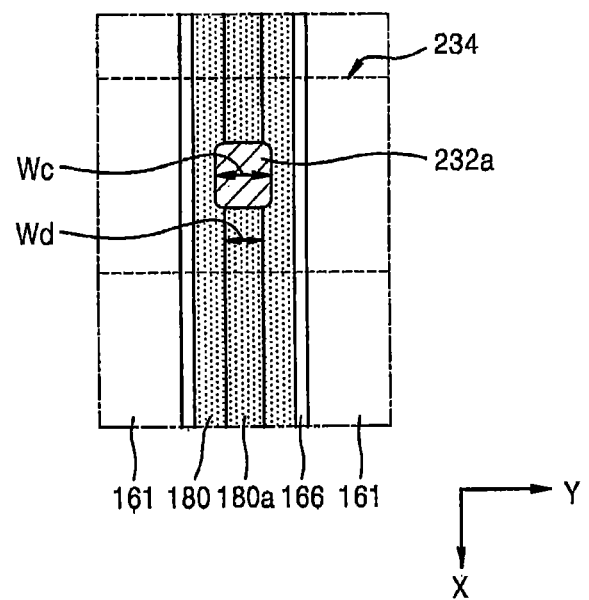
FIG. 5B is a plan view of parts of FIG. 5A.

FIG. 5A is a cross-sectional view of a vertical memory device, according to other example embodiments of the inventive concept, and FIG. 5B is a plan view of parts of FIG. 5A. In FIGS. 5A and 5B, the same reference numerals as in FIGS. 4A and 4B represent the same elements, and detailed description thereof will be omitted to avoid redundant description.

Referring to FIGS. 5A and 5B, a vertical memory device illustrated in FIGS. 5A and 5B may have substantially the same structure as the vertical memory device in FIGS. 4A and 4B with the exception of a second common source line contact plug 180a, a common source line buried film pattern 182a, and a common source bit line contact 232a.

The common source line buried film pattern 182a may be disposed in the recessed region RR delimited by the inner sidewall 180i of the first common source line contact plug 180 and may be a line shape extending in the second direction (X direction). The common source line buried film pattern 182a may include an insulating material, such as silicon oxide. The common source line buried film pattern 182a may have a void VC2 therein. The void VC2 may be formed to be spaced apart from the inner sidewall 180i of the first common source line contact plug 180.

The second common source line contact plug 180a may be partially in contact with the inner sidewall 180i of the first common source line contact plug 180 and may be disposed on the common source line buried film pattern 182a. The second common source line contact plug 180a may be a line shape extending in the second direction (X direction). A top surface of the second common source line contact plug 180a may be positioned on substantially the same plane as respective top surfaces of the separation film pattern 166, the first common source line contact plug 180, and/or the insulative capping film 161. The common source bit line contact 232a may be in contact with the top surfaces of the first common source line contact plug 180 and the second common source line contact plug 180a or may be electrically connected to the first and second common source line contact plugs 180 and 180a. In one embodiment, the common source bit line contact 232a may be electrically connected to the inner sidewall 180i of the first common source line contact plug 180. The common source bit line contact 232a may be electrically connected to the common source bit line 234. The second common source line contact plug 180a may be in contact with an upper portion of the inner sidewall 180i of the first common source line contact plug 180 and may be in contact with a top surface of the common source line buried film pattern 182a. When viewed from the second direction (Y direction), a width We of the common source bit line contact 232a may be greater than a width Wd of the second common source line contact plug 180a.

According to the above structure, a contact area between the first common source line contact plug 180, the second common source line contact plug 180a, and the common source bit line contact 232a is relatively large. Therefore, a contact resistance therebetween may be reduced.

Figure 6A:
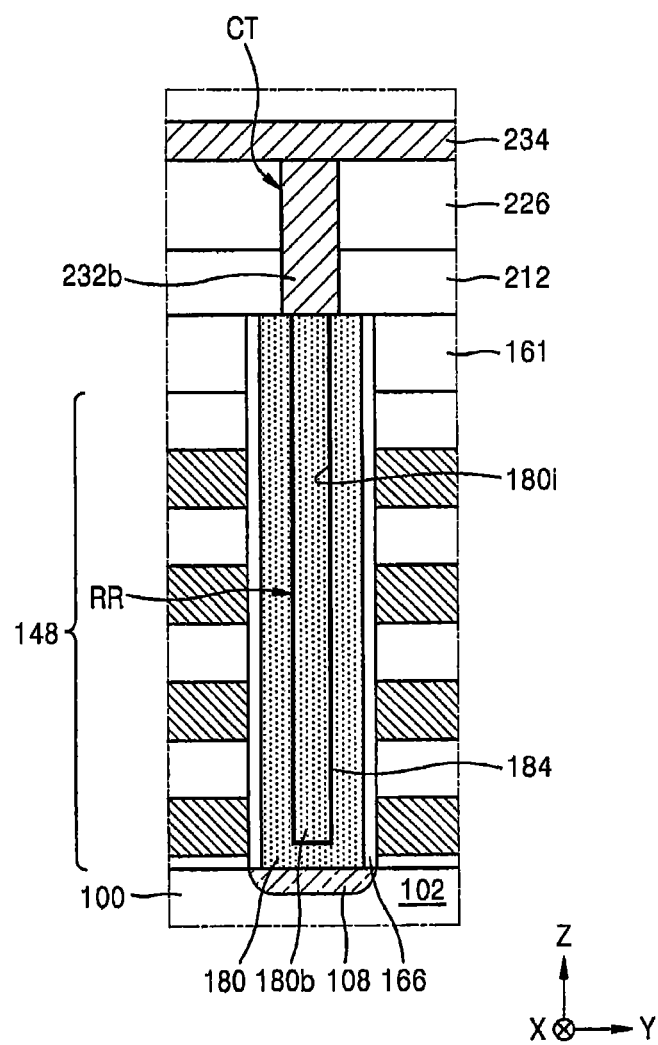
FIG. 6A is a cross-sectional view of a vertical memory device, according to still other example embodiments.
Figure 6B:
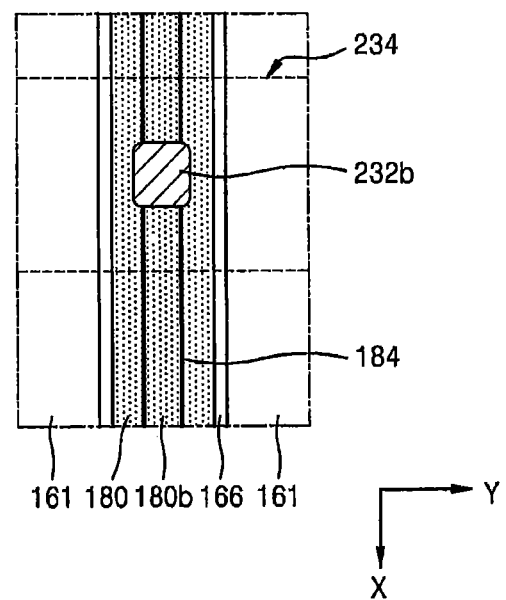
FIG. 6B is a plan view of parts of FIG. 6A FIGS. 7A, 7B, and 7C are views of a vertical memory device, according to still other example embodiments of the inventive concept.

FIG. 6A is a cross-sectional view of a vertical memory device, according to still other example embodiments of the inventive concept, and FIG. 6B is a plan view of parts of FIG. 6A. In FIGS. 6A and 6B, the same reference numerals represent the same elements as in FIGS. 4A and 4B, and detailed description thereof will be omitted to avoid redundant description.

Referring to FIGS. 6A and 6B, a vertical memory device illustrated in FIGS. 6A and 6B may have substantially the same structure as the vertical memory device in FIGS. 4A and 4B with the exception of the second common source line contact plug 180b, the barrier film pattern 184, and the common source bit line contact 232b.

The barrier film pattern 184 may be disposed on the inner sidewall 180i of the first common source line contact plug 180 in the recessed region RR delimited by the inner sidewall 180i of the first common source line contact plug 180 and may have a line shape while extending in the second direction (X direction). The second common source line contact plug 180b may be disposed on the barrier film pattern 184 in the recessed region RR and may have a line shape extending in the second direction (X direction). A top surface of the second common source line contact plug 180b may be positioned on substantially the same plane as respective top surfaces of the separation film pattern 166, the first common source line contact plug 180, the barrier film pattern 184 and/or the insulative capping film 161. The common source bit line contact 232b may be in contact with the top surfaces of the first common source line contact plug 180, the barrier film pattern 184, and the second common source line contact plug 180b, or may be electrically connected to the first common source line contact plug 180, the barrier film pattern 184, and the second common source line contact plug 180b. In one embodiment, the common source bit line contact 232b may be electrically connected to the inner sidewall 180i of the first common source line contact plug 180. The common source bit line contact 232b may be electrically connected to the common source bit line 234. The barrier film pattern 184 may include a metal and/or a conductive metal nitride. For example, the barrier film pattern 184 may include titanium/titanium nitride (Ti/TiN).

According to the above structure, a contact area between the first common source line contact plug 180, the second common source line contact plug 180b, and the common source bit line contact 232b is relatively large. Therefore, a contact resistance therebetween may be reduced.

Referring again to FIGS. 2, 3A, 3B, and 3C, a peripheral circuit of the vertical memory device may be formed in the peripheral circuit region PCR of the substrate 100. The peripheral circuit may include, for example, transistors, wirings, or contacts. For example, a peripheral circuit gate structure 118 may be formed on the second active area 104 of the peripheral circuit region PCR. The peripheral circuit gate structure 118 may include a peripheral circuit gate insulating film pattern 112, a peripheral circuit gate electrode 114, and a peripheral circuit gate capping film 116, which are sequentially stacked on the substrate 100. A second impurity region 110 may be formed at an upper portion of the second active area 104 adjacent to the peripheral circuit gate structure 118. The peripheral circuit gate structure 118 and the second impurity region 110 may constitute a transistor PTR. In this case, the second impurity region 110 may be provided as a source/drain region of the peripheral circuit transistor PTR. A peripheral circuit gate spacer 120 may be further formed to cover sidewalls of the peripheral circuit gate structure 118.

A peripheral circuit protection film 122 may be formed on the substrate 100 of the peripheral circuit region PCR and cover the peripheral circuit gate structure 118, the peripheral circuit gate spacer 120, and the second impurity region 110. Accordingly, the peripheral circuit such as the transistor PTR, may be protected by the peripheral circuit protection film 122.

The vertical memory device may include a mold protection film 150 formed in a portion of the cell array region CAR and in the peripheral circuit region PCR of the substrate 100. The mold protection film 150 may cover a side of the step-shaped cell gate stack structure 148 and the peripheral circuit protection film 122. The mold protection film 150 may have a reverse-step-shaped side that contacts the side of the step-shaped cell gate stack structure 148 in a self-aligned manner. The mold protection film 150 may include an insulating material, such as silicon oxide.

A top surface of the cell gate stack structure 148 may be positioned on substantially the same plane as top surfaces of the mold protection film 150 and the pad 160 and 160a formed on the vertical channel structure CHS. In one embodiment, the top surface of the uppermost interlayer insulating film pattern 132e of the cell gate stack structure 148 may be positioned on substantially the same plane as the top surfaces of the mold protection film 150 and the pad 160 and 160a formed on the vertical channel structure CHS.

The insulative capping film 161 may be formed on the cell gate stack structure 148, the pad 160 and 160a formed on the vertical channel structure CHS, and the mold protection film 150 in the cell array region CAR and the peripheral circuit region PCR. The first upper insulating film 212 and the second upper insulating film 226 may be sequentially formed on the insulative capping film 161 in the cell array region CAR and the peripheral circuit region PCR. The first and second upper insulating films 212 and 226 may include an insulating material, such as silicon oxide.

The vertical memory device may include a plurality of cell gate line contact plugs 200 that pass through the first upper insulating film 212, the insulative capping film 161, the mold protection film 150, and the interlayer insulating film patterns 132a, 132b, 132c, 132d, and 132e formed in the cell array region CAR adjacent to the peripheral circuit region PCR and extend in the first direction (Z direction). Each of the cell gate line contact plugs 200 may contact each of the cell gate lines 144a, 144b, 144c, and 144d. For convenience, the cell gate line contact plug 200 contacting the uppermost cell gate line 144d is not illustrated in FIGS. 2 and 3C, but the vertical memory device may include the cell gate line contact plug 200 contacting the uppermost cell gate line 144d. In addition, the vertical memory device may include a peripheral circuit contact plug 210 that passes through the first upper insulating film 212, the insulative capping film 161, the mold protection film 150, and the peripheral circuit protection film 122 of the peripheral circuit region PCR and extends in the first direction (Z direction). The peripheral circuit contact plug 210 may be in contact with the second impurity region 110, or may be electrically connected thereto. A top surface of the peripheral circuit contact plug 210 may be positioned on substantially the same plane as top surfaces of the cell gate line contact plugs 200.

The vertical memory device may include a cell gate line contact wiring 214 electrically connected to the cell gate line contact plugs 200 on the first upper insulating film 212. As illustrated in FIG. 2, the cell gate line contact wiring 214 may extend in the third direction (Y direction) and may be electrically connected to the plurality of cell gate line contact plugs 200 contacting the respective cell gate lines 144a, 144b, 144c, and 144d of the different cell gate line structures 144.

The vertical memory device may include a peripheral circuit contact wiring 216 that is electrically connected to the peripheral circuit contact plug 210 on the first upper insulating film 212.

The vertical memory device may include a first connection contact 222 that passes through the second upper insulating film 226 and contacts the cell gate line contact wiring 214, a second connection contact 223 that passes through the second upper insulating film 226 and contacts the peripheral circuit contact wiring 216, and a connection wiring 224 that connects the first connection contact 222 and the second connection contact 223 on the second upper insulating film 226. In the configuration illustrated in FIG. 2, the first connection contact 222, the second connection contact 223, and the connection wiring 224 are not present in the cross-section taken along the line C1-C2 of FIG. 2. However, for convenience of explanation, the first connection contact 222, the second connection contact 223, and the connection wiring 224 are shown by dashed lines in FIG. 3C. The cell gate line contact plugs 200 and the peripheral circuit contact plug 210 may be electrically connected to each other through the connection wiring 224.

Auxiliary cell bit line contacts 218 that pass through the first upper insulating film 212 and the insulative capping film 161 and contact the respective pads 160 may be formed in the cell array region CAR. An auxiliary cell bit line 220 that contact the auxiliary cell bit line contacts 218 may be formed on the first upper insulating film 212. As illustrated in FIGS. 2 and 3B, the auxiliary cell bit line 220 may electrically connect at least two auxiliary cell bit line contacts 218 disposed on both sides of the first common source line contact plug 180.

The second upper insulating film 226 that covers the auxiliary cell bit line 220, the cell gate line contact wiring 214, and the peripheral circuit contact wiring 216 may be formed on the first upper insulating film 212.

As illustrated in FIGS. 3B and 3C, the vertical memory device may include a cell bit line contact 228 that passes through the second upper insulating film 226 and contacts the auxiliary cell bit line 220, and a cell bit line 230 that is disposed on the second upper insulating film 226 and contacts the cell bit line contact 228. In the configuration illustrated in FIG. 2, the cell bit line contact 228 and the cell bit line 230 are not present in the cross-section taken along the line B1-B2 of FIG. 2. However, for convenience of explanation, the cell bit line contact 228 and the cell bit line 230 are shown by dashed lines in FIG. 3B. A plurality of cell bit lines 230 may extend in the third direction (Y direction) and be formed in the second direction (X direction). The cell bit line 230 may be electrically connected to the vertical channel structure CHS through the cell bit line contact 228, the auxiliary cell bit line 220, the auxiliary cell bit line contact 218, and the pad 160. Top surfaces of the cell bit line 230, the common source bit line 234, and the connection wiring 224 may be positioned on a substantially same plane.

The common source bit line 234 may correspond to the common source line CSL. The common source bit line 234 may extend in the third direction (Y direction) and may be formed between the plurality of cell bit lines 230.

In one embodiment, as illustrated in FIG. 3C, the vertical memory device may include a plurality of cell gate line contact plugs 200 that pass through the first upper insulating film 212, the insulative capping film 161, the mold protection film 150, and the interlayer insulating film patterns 132a, 132b, 132c, 132d, and 132e formed in the cell array region CAR adjacent to the peripheral circuit region PCR and extend in the first direction (Z direction). Although not shown, unlike that illustrated in FIG. 3C, the vertical memory device may include a peripheral circuit contact plug 210 that passes through the second upper insulating film 226, the first upper insulating film 212, the insulative capping film 161, the mold protection film 150, and the peripheral circuit protection film 122, and extends in the first direction (Z direction). In this case, a top surface height of the cell gate line contact plug 200 from the substrate 100 may differ from, a top surface height of the peripheral circuit contact plug 210 from the substrate 100.

Figure 7A:
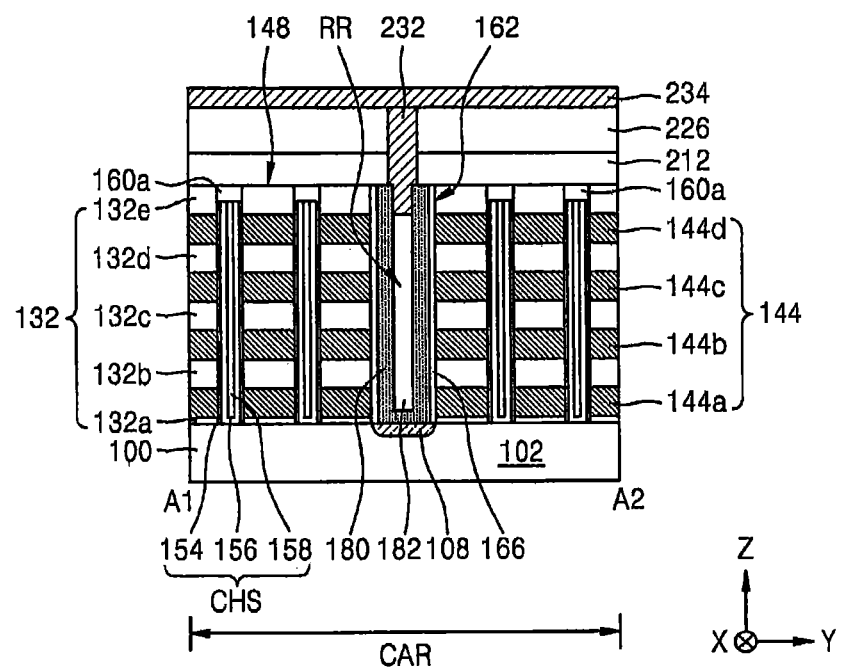
FIG. 7A is an exemplary cross-sectional view taken along the line A1-A2 of FIG. 2.
Figure 7B:
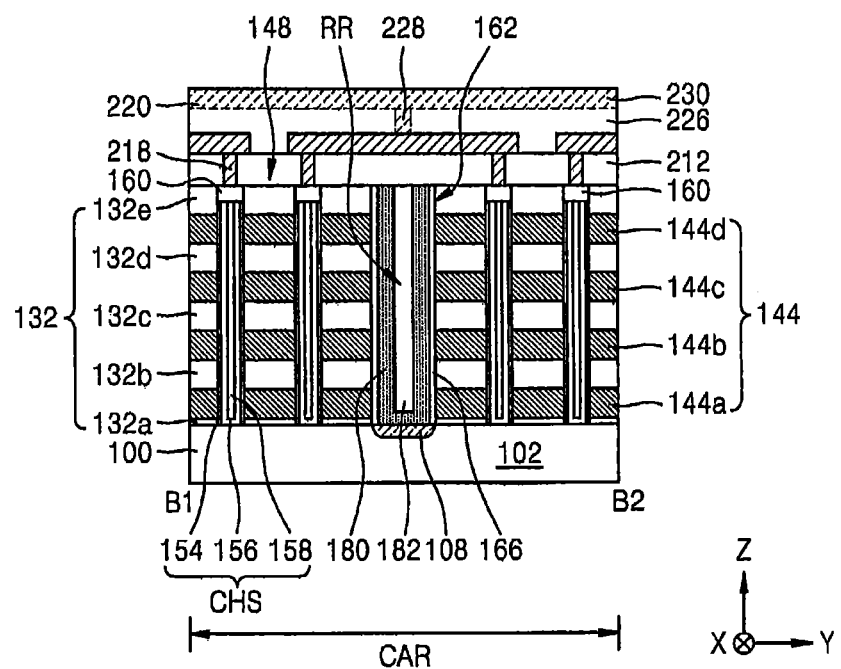
FIG. 7B is an exemplary cross-sectional view taken along the line B1-B2 of FIG. 2.
Figure 7C:
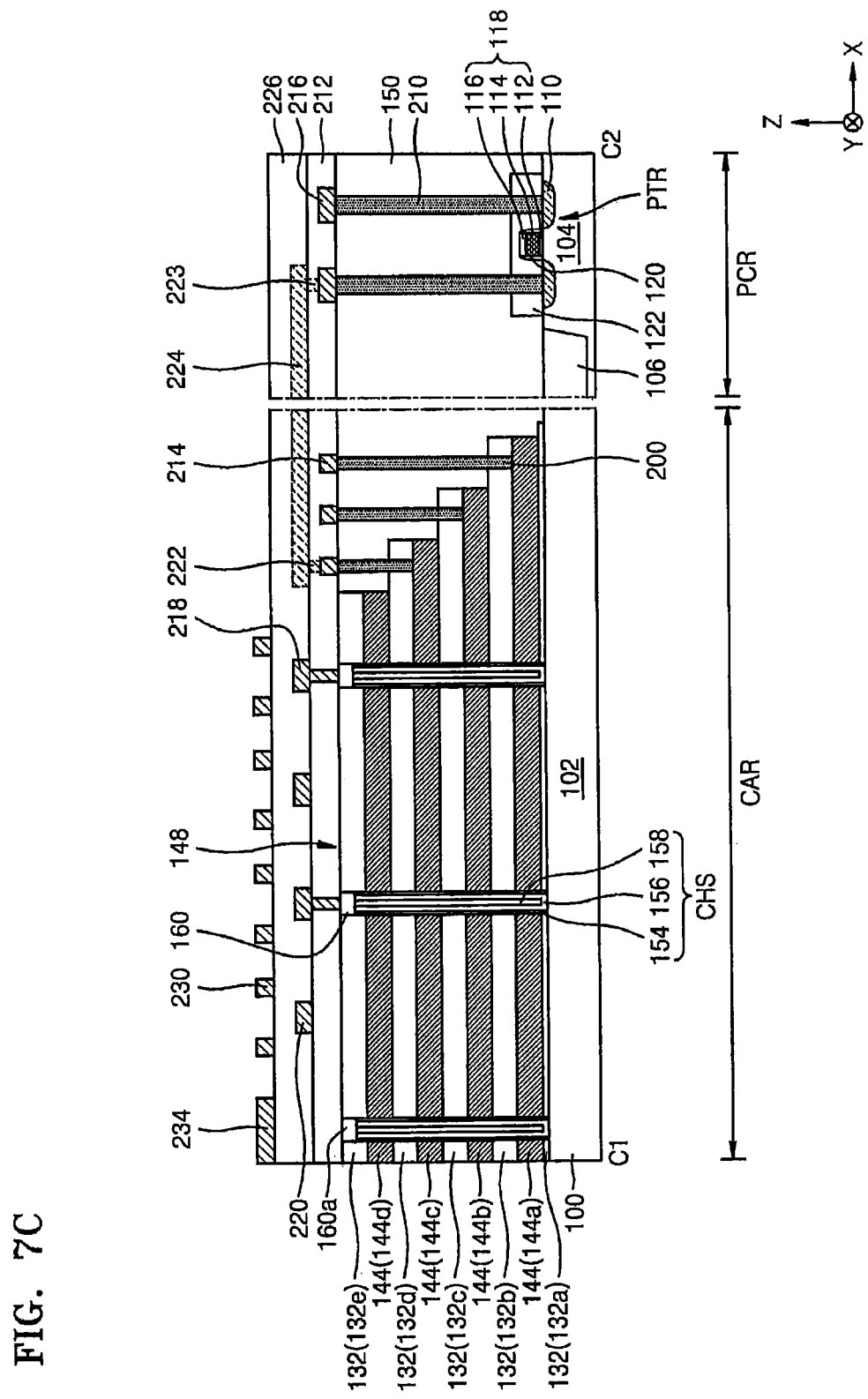
FIG. 7C is an exemplary cross-sectional view taken along the line C1-C2 of FIG. 2

FIGS. 7A, 7B, and 7C are views of a vertical memory device, according to still other example embodiments of the inventive concept, FIG. 7A is an exemplary cross-sectional view taken along the line A1-A2 of FIG. 2, FIG. 7B is an exemplary cross-sectional view taken along the line B1-B2 of FIG. 2, and FIG. 7C is an exemplary cross-sectional view taken along the line C1-C2 of FIG. 2.

In FIGS. 7A, 7B, and 7C, the same reference numerals represent the same elements as in FIGS. 3A, 3B, 3C, 4A, 4B, 5A, 5B, 6A, and 6B, and detailed description thereof will be omitted in order to avoid redundant description.

Referring to FIGS. 7A, 7B, and 7C, a vertical memory device illustrated in FIGS. 7A, 7B, and 7C may have substantially the same structure as the vertical memory device in FIGS. 3A, 3B, 3C, 4A, and 4b, except that the insulative capping film 161 is omitted and respective heights along the first direction (Z direction) of the auxiliary cell bit line contact 218, the cell gate line contact plug 200, and the peripheral circuit contact plug 210 are different from each other. The vertical memory device according to the example embodiment may not include the insulative capping film 161 illustrated in FIGS. 3A through 3C.

The first common source line contact plug 180 may pass through the cell gate stack structure 148 and extend in the first direction (Z direction) and the second direction (X direction). The plurality of cell gate line contact plugs 200 may pass through the mold protection film 150 and the interlayer insulating film patterns 132a, 132b, 132c, 132d, and 132e of the cell array region CAR and may contact the respective cell gate lines 144a, 144b, 144c, and 144d. The peripheral circuit contact plug 210 may pass through the mold protection film 150 and the peripheral circuit protection film 122 of the peripheral circuit region PCR and may extend in the first direction (Z direction).

The auxiliary cell bit line contacts 218 may pass through the first upper insulating film 212 and may contact the respective pads 160. The auxiliary cell bit line 220 that contacts the auxiliary cell bit line contact 218 may be formed on the first upper insulating film 212. The cell gate line contact wiring 214 that is electrically connected to the respective cell gate line contact plugs 200 may be formed on the mold protection film 150 of the cell array region CAR. In addition, the peripheral circuit contact wiring 216 that is electrically connected to the peripheral circuit contact plug 210 may be formed on the mold protection film 150 of the peripheral circuit region PCR.

The first connection contact 222 that passes through the first upper insulating film 212 and is in contact with the cell gate line contact wiring 214, and the second connection contact 223 that passes through the first upper insulating film 212 and is in contact with the peripheral circuit contact wiring 216 are formed. The connection wiring 224 that connects the first connection contact 222 and the second connection contact 223 are formed on the first upper insulating film 212.

A top surface of the first common source line contact plug 180 may be positioned on substantially the same plane as respective top surfaces of the cell gate line contact plug 200, the peripheral circuit contact plug 210, the separation film pattern 166, the pad 160 and 160a of the vertical channel structure CHS, the cell gate stack structure 148 and/or the mold protection film 150.

Figure 8A:
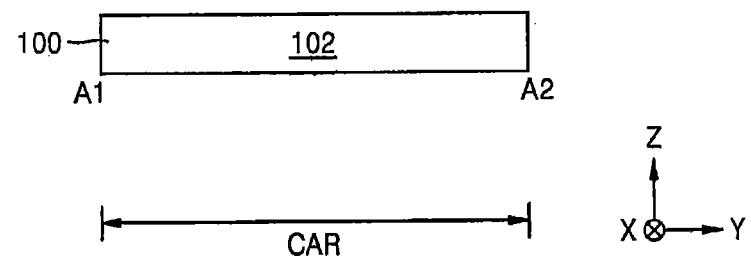

FIGS. 8A through 14C are cross-sectional views illustrating a method of manufacturing a vertical memory device, according to further example embodiments of the inventive concept. For example, FIGS. 8A through 14C are cross-sectional views illustrating a method of manufacturing the vertical memory device illustrated in FIGS. 2, 3A, 3B, 3C, 4A, 4B, 5A, 5B, 6A, and 6B. FIGS. 8A, 9A, . . . , and 14A are cross-sectional views of process procedures corresponding to the cross-sections taken along the line A1-A2 of FIG. 2. FIGS. 8B, 9B, . . . , and 14B are cross-sectional views of process procedures corresponding to the cross-sections taken along the line B1-B2 of FIG. 2. FIGS. 8C, 9C, . . . , and 14C are cross-sectional views of process procedures corresponding to the cross-sections taken along the line C1-C2 of FIG. 2.

Figure 8B:
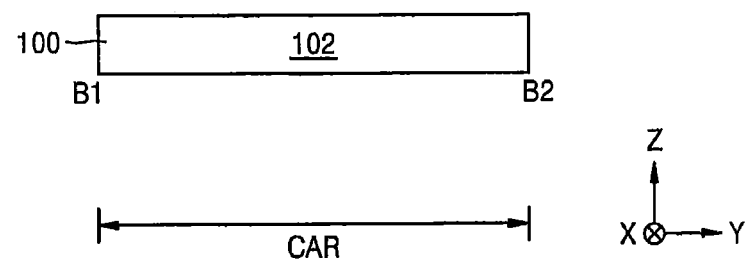
Figure 8C:
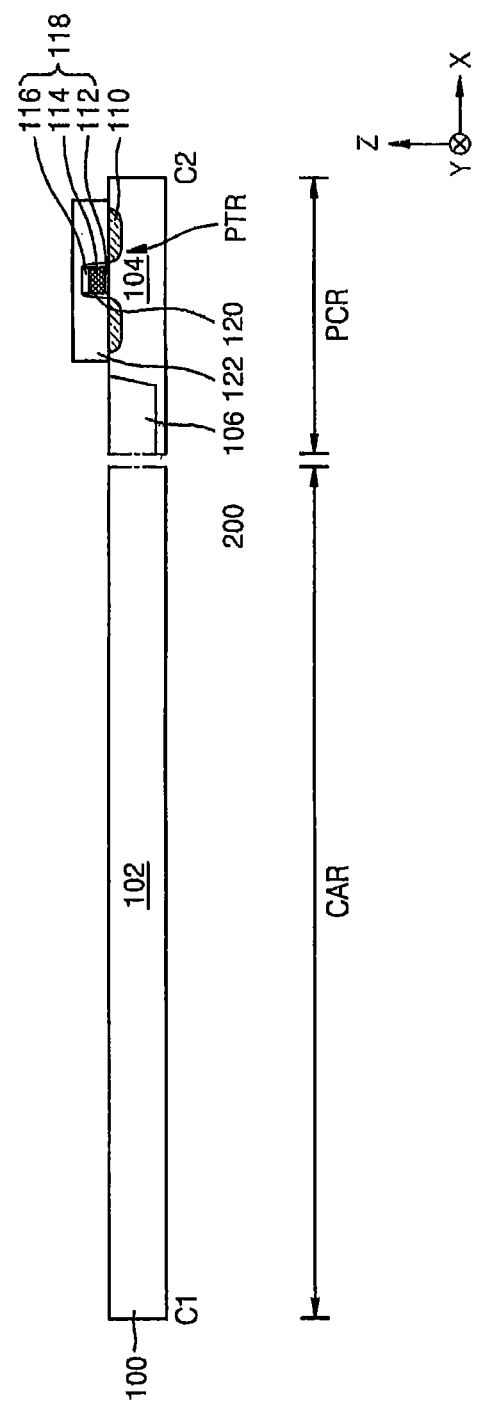

Referring to FIGS. 8A, 8B, and 8C, a device isolation region 106 is formed to delimit active areas 102 and 104 in an upper portion of the substrate 100 including a cell array region CAR and a peripheral circuit region PCR. The active areas 102 and 104 may include a first active area 102 of the cell array region CAR and a second active area 104 of the peripheral circuit region PCR. Examples of the substrate 100 may include a semiconductor substrate including a semiconductor material, such as single-crystal silicon or single-crystal germanium.

A peripheral circuit gate structure 118 and a second impurity region 110 are formed on the substrate 100 of the peripheral circuit region PCR. The peripheral circuit gate structure 118 may include a peripheral circuit gate insulating film pattern 112, a peripheral circuit gate electrode 114, and a peripheral circuit gate capping film 116, which are sequentially stacked on the substrate 100.

In one embodiment, the peripheral circuit gate insulating film pattern 112 may be formed of silicon oxide and/or a metal oxide. In one embodiment, the peripheral circuit gate electrode 114 may be formed of a metal, a conductive metal nitride and/or doped polysilicon. The peripheral circuit gate capping film 116 may be formed of silicon nitride.

The peripheral circuit gate structure 118 and the second impurity region 110 may constitute a peripheral circuit transistor PTR formed in the peripheral circuit region PCR.

A peripheral circuit gate spacer 120 may be formed to cover both sidewalls of the peripheral circuit gate structure 118.

After that, a peripheral circuit protection film 122 may be formed to protect the transistor PTR. For example, after a protection film is formed on the substrate 100 to cover the second impurity region 110, the peripheral gate structure 118, and the peripheral gate spacer 120, the peripheral circuit protection film 122 may be formed by removing the protection film formed on the cell array region CAR. The peripheral circuit protection film 122 may include an oxide film.

Figure 9A:
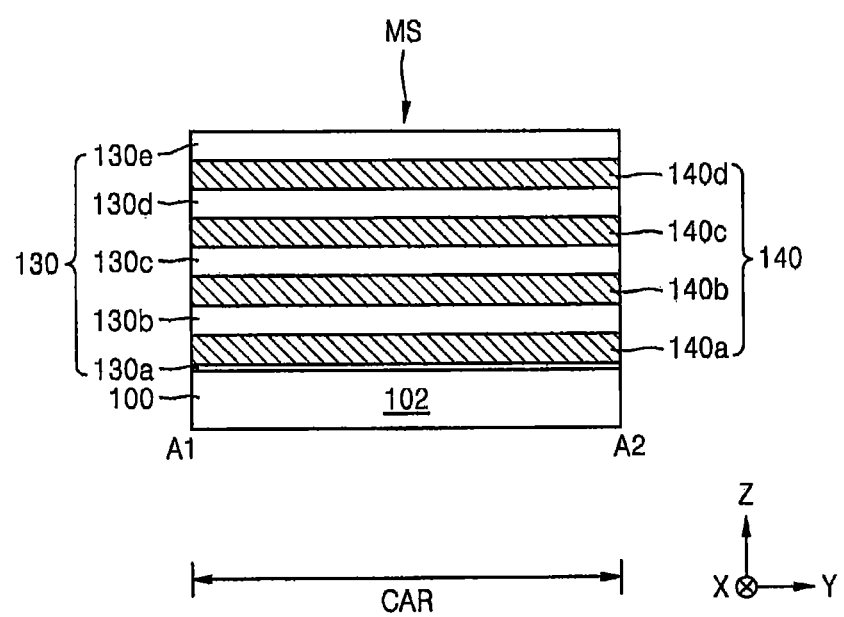
Figure 9B:
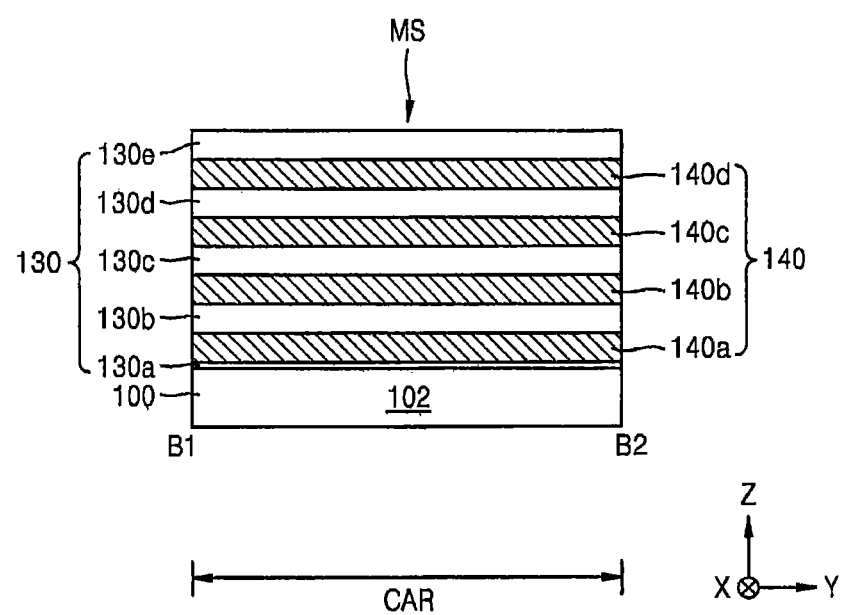
Figure 9C:
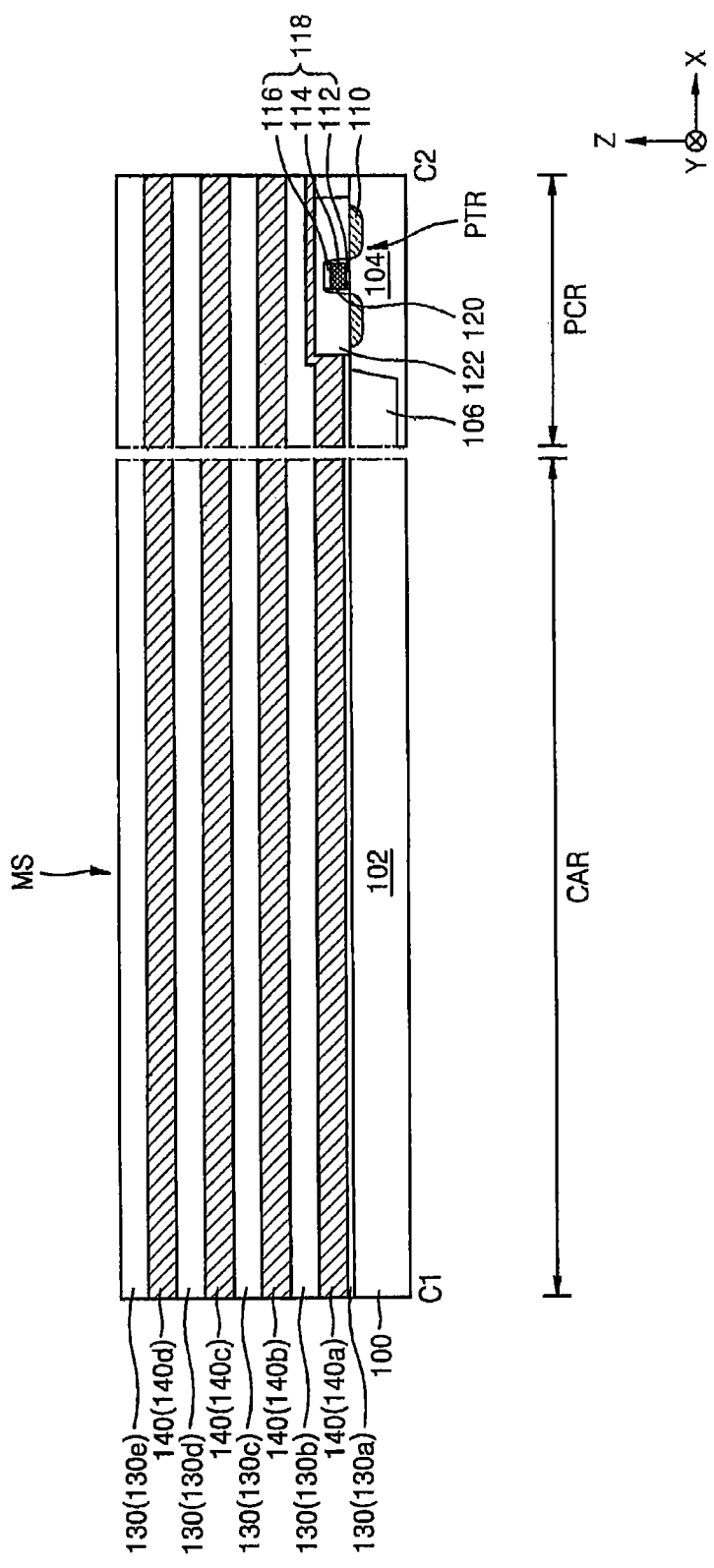

Referring to FIGS. 9A, 9B, and 9C, a mold structure MS is formed on the substrate 100 including the cell array region CAR and the peripheral circuit region PCR by alternately stacking a plurality of interlayer insulating films 130 (130a, 130b, 130c, 130d, 130e) and a plurality of sacrificial films 140 (140a, 140b, 140c, 140d) along a first direction (Z direction) perpendicular to a top surface of the substrate 100.

In one embodiment, the interlayer insulating films 130 may be formed of an oxide-based material, such as silicon oxide ($SiO_2$), silicon oxycarbide (SiOC), or fluorinated silicon oxide (SiOF). The sacrificial films 140 may be formed of a material that has an etch selectivity to the interlayer insulating films 130 and is easily removable by a wet etching process. For example, the sacrificial films 140 may be formed of a nitride-based material, such as silicon nitride (SiN) or silicon boron nitride (SiBN).

The interlayer insulating films 130 and the sacrificial films 140 may be formed through a chemical vapour deposition (CVD) process, a plasma enhanced chemical vapour deposition (PECVD) process, or a spin coating process. In one embodiment, the lowermost interlayer insulating film 130a may be formed by performing a thermal oxidation process on the top surface of the substrate 100. In this case, the lowermost interlayer insulating film 130a may be formed to be thinner than the remaining interlayer insulating films 130b, 130c, 130d, and 130e.

The sacrificial films 140 may be removed through a subsequent process and provide a space in which a ground selection line GSL, a word line WL, and a string selection line SSL are to be formed. Accordingly, the number of stacking of the interlayer insulating films 130 and the sacrificial films 140 may be changed according to the number of stacking of the ground selection line GSL, the word line WL, and the string selection line SSL to be formed later. For example, single layers of the ground selection line GSL and the string selection line SSL, and two layers of the word line WL may be formed. In this case, as illustrated in FIGS. 9A, 9B, and 9C, four layers of the sacrificial films 140 may be stacked, and five layers of the interlayer insulating films 130 may be stacked. However, the number of the interlayer insulating films 130 and the sacrificial films 140 is not particularly limited. For example, two ground selection line GSL, two string selection line SSL, and four, eight, or sixteen word lines WL may be formed. In this case, eight, twelve, or twenty sacrificial films 140 may be formed, and nine, thirteen, or twenty-one interlayer insulating films 130 may be formed. The number of word lines WL may be sixteen or more, for example, $2^n$ (where n is an integer equal to or greater than 4). As illustrated in FIGS. 9A, 9B, and 9C, the lowermost layer of the mold structure MS may be the lowermost interlayer insulating film 130a, and the uppermost layer of the mold structure MS may be the uppermost interlayer insulating film 130e. The sacrificial films 140 may be formed between the respective interlayer insulating films 130.

Figure 10A:
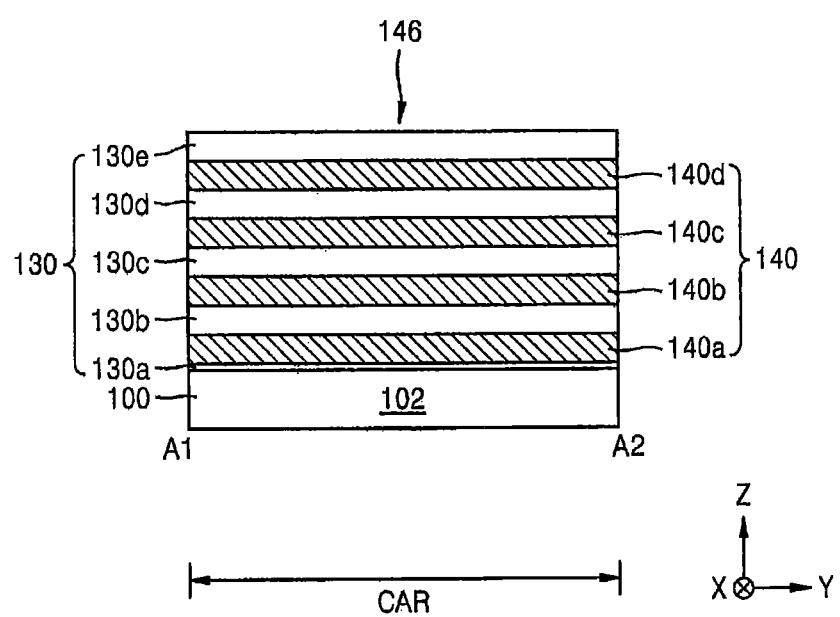
Figure 10B:
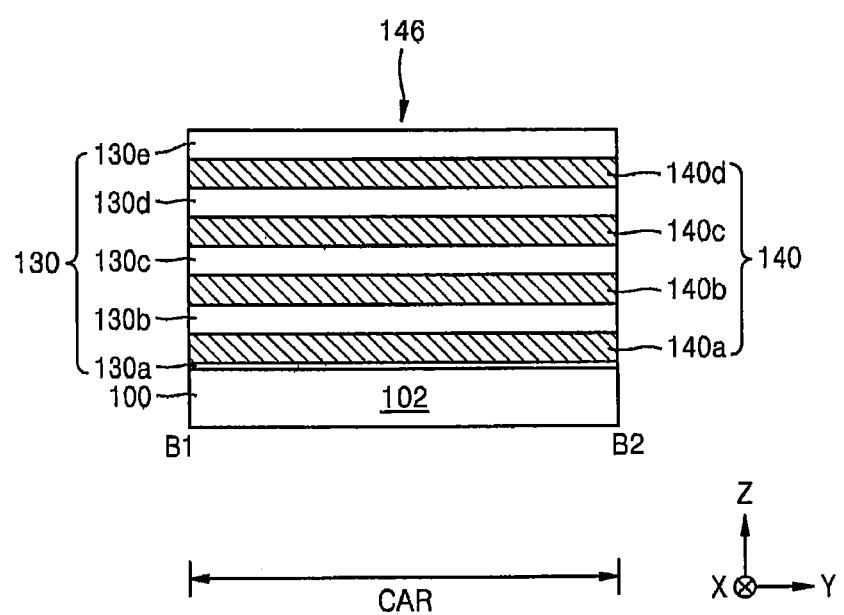
Figure 10C:
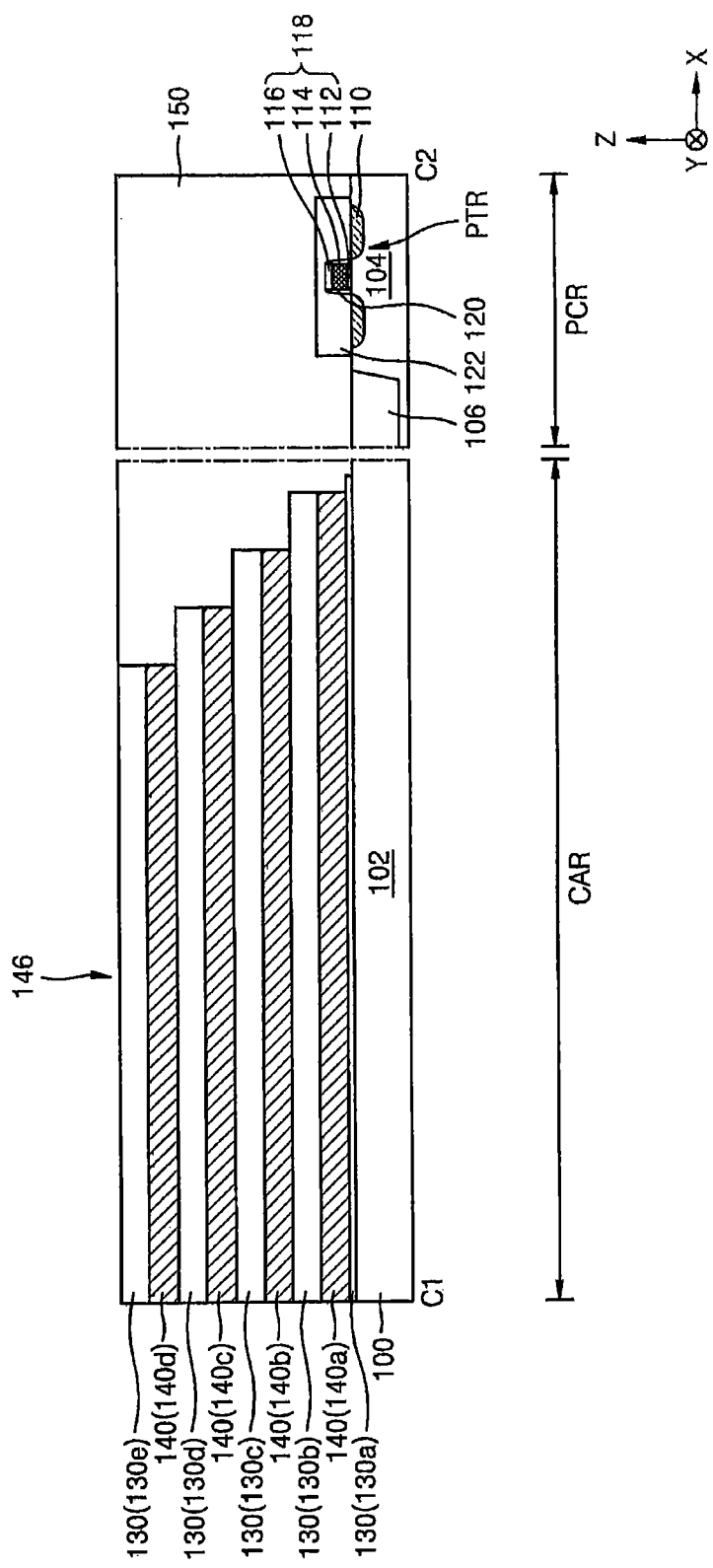

Referring to FIGS. 10A, 10B, and 10C, a step-shaped mold structure 146 may be formed by partially etching the interlayer insulating films 130 and the sacrificial films 140. For example, a photoresist pattern (not shown), which partially covers the uppermost interlayer insulating film 130e, may be formed, and both ends of the interlayer insulating films 130e, 130d, 130c, and 130b, and the sacrificial films 140d, 140c, 140b, and 140a may be etched by using the photoresist pattern as an etching mask. After the width of the photoresist pattern is reduced by partially removing both ends of the photoresist pattern and both ends of the interlayer insulating films 130e, 130d, and 130c, the sacrificial films 140d, 140c, and 140b may be etched by using the resultant photoresist pattern as an etching mask. Similarly, the step-shaped mold structure 146 as illustrated in FIGS. 10A, 10B, and 10C, may be formed by repeating the etching process.

The interlayer insulating films 130 and the sacrificial films 140, which are formed in a portion of the cell array region CAR and in the peripheral circuit PCR, may be substantially removed. During the etching process for forming the step-shaped mold structure 146, the peripheral circuit transistor PTR formed in the peripheral circuit region PCR may be protected by the peripheral circuit protection film 122. In one embodiment, the lowermost interlayer insulating film 130a formed on the substrate 100 may be partially removed in the etching process. In one embodiment, the lowermost interlayer insulating film 130a may remain without being substantially etched during the etching process.

After forming the step-shaped mold structure 146, a mold protection film 150 that covers a side or steps of the step-shaped mold structure 146 may be formed on the substrate 100 including a portion of the cell array region CAR and the peripheral circuit region PCR. For example, an insulating film that covers the step-shaped mold structure 146 is formed on the substrate 100 by using an insulating material, such as silicon oxide through a CVD process or a spin coating process.

Next, the mold protection film 150 may be formed by planarizing an upper portion of the insulating film until the uppermost interlayer insulating film 130e is exposed. The planarization process may include a chemical mechanical polishing (CMP) and/or an etch-back process. In one embodiment, the mold protection film 150 may be formed of substantially the same material as the interlayer insulating film 130 or a similar material to the interlayer insulating film 130. In this case, the mold protection film 150 may be substantially combined or integrated with the interlayer insulating films 130. In one embodiment, a top surface of the step-shaped mold structure 146 may be positioned on substantially the same plane as a top surface of the mold protection film 150.

Figure 11A:
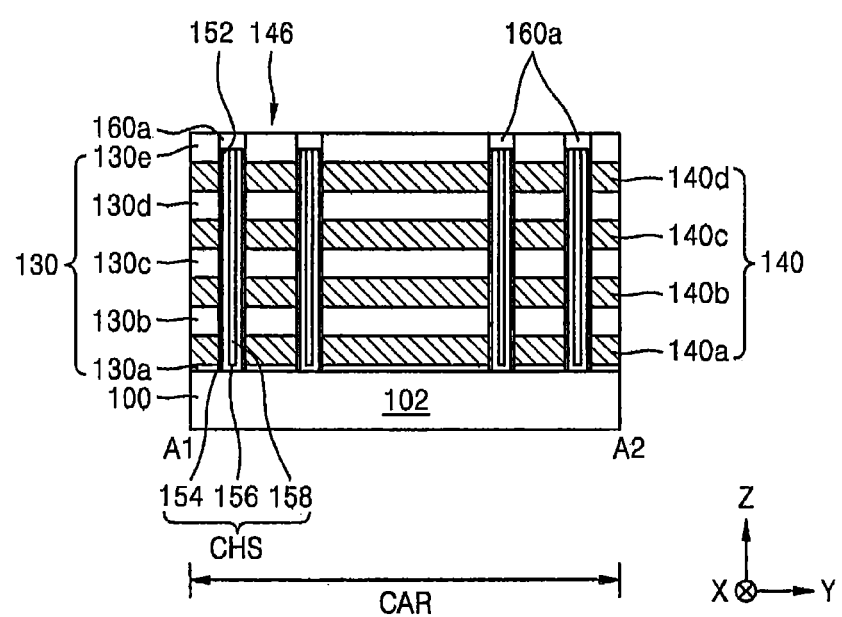
Figure 11B:
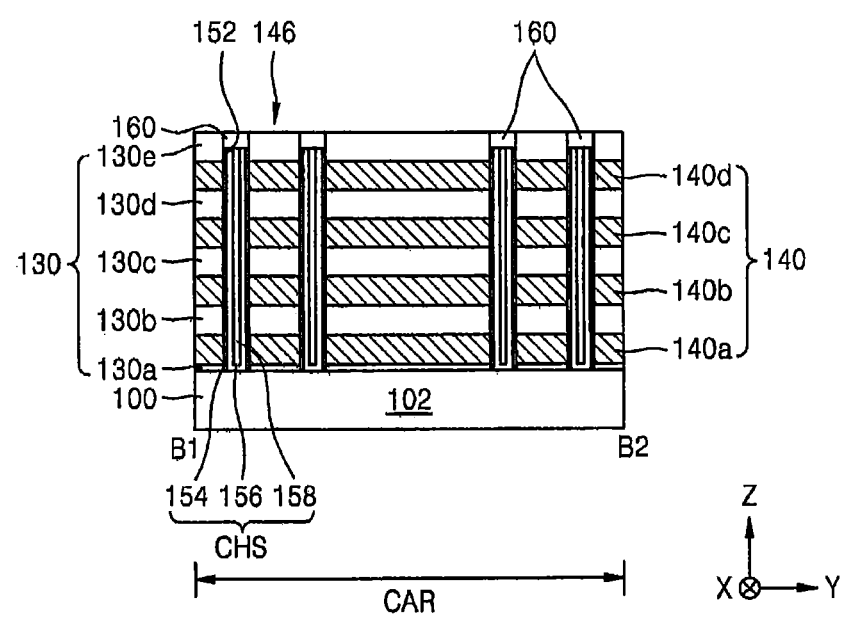
Figure 11C:
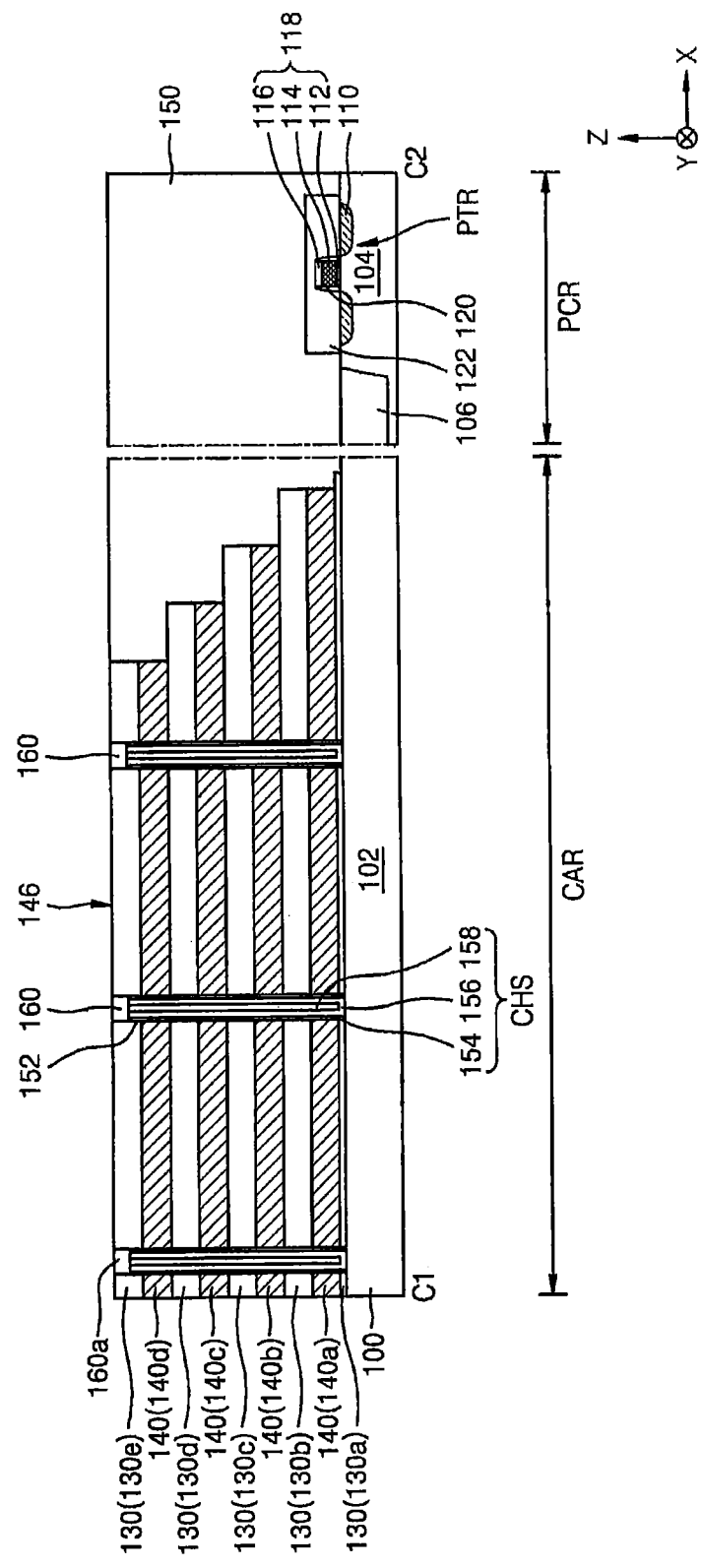

Referring to FIGS. 11A, 11B, and 11C, a plurality of channel holes 152 are formed to pass through the step-shaped mold structure 146 of the cell array region CAR and to extend in the first direction (Z direction) perpendicular to the surface of the substrate 100.

For example, a hard mask (not shown) may be formed on the uppermost interlayer insulating film 130e, and the channel holes 152 may be formed by etching the interlayer insulating films 130 and the sacrificial films 140 of the step-shaped mold structure 146 through a dry etching process using the hard mask as an etching mask. After the channel holes 152 are formed, a top surface of the substrate 100 may be exposed through the channel holes 152. For example, the hard mask may be formed of a silicon-based or a carbon-based spin-on-hard mask (SOH) material or a photoresist material.

As illustrated in FIGS. 11A, 11B, and 11C, the plurality of channel holes 152 may be formed in the second direction (X direction) and the third direction (Y direction).

After the channel holes 152 are formed, the hard mask may be removed through an ashing and/or a strip process.

A vertical channel structure CHS may be formed to fill the respective channel hole 152 by sequentially stacking a dielectric film structure 154, a channel 156, and a channel buried film pattern 158 from a sidewall of the respective channel hole 152. The vertical channel structure CHS may be formed to pass through the step-shaped mold structure 146 and to extend in the first direction (Z direction).

Although not specifically illustrated, the dielectric film structure 154 may be formed by sequentially stacking a blocking film, a charge storage film, and a tunnel insulating film. The blocking film may be formed of an oxide, such as silicon oxide. The charge storage film may be formed of a nitride, such as silicon nitride or a metal oxide. The tunnel insulating film may be formed of an oxide, such as silicon oxide. For example, the dielectric film structure 154 may be formed to have an ONO structure. The blocking film, the charge storage film, and the tunnel insulating film may be formed through a CVD process, a PECVD process, or an atomic layer deposition (ALD) process.

The channel 156 may be formed of doped or undoped polysilicon or amorphous silicon. On the other hand, after polysilicon or amorphous silicon as the channel 156 is formed, the polysilicon or amorphous silicon may be converted into single-crystal silicon by thermal treatment or laser beam irradiation. In a case where polysilicon or amorphous silicon is converted in to single-crystal silicon, a defect in the channel 156 may be removed, thus improving the function of the channel 156. The channel buried film pattern 158 may be formed of an insulating material, such as silicon oxide or silicon nitride. The channel 156 and the channel buried film pattern 158 may be formed through a CVD process, a PECVD process, a spin coating process, a physical vapour deposition (PVD) process, or an ALD process.

The channel may have a cup shape, and the channel buried film pattern 158 may have a pillar shape or a cylinder shape, the inside of which is fully filled. The dielectric film structure 154 may have a structure in which the tunnel insulating film, the charge storage film, and the blocking film are sequentially stacked from an outer sidewall of the channel 156. In one embodiment, in a case where the channel 156 is formed to fully fill the channel hole 152, the channel buried film pattern 158 may not be formed.

In one embodiment, after the channel hole 152 illustrated in FIGS. 11A, 11B, and 11C is formed, a semiconductor pattern (not shown) that fills a lower portion of the channel hole 152 may be formed prior to forming the dielectric film structure 154, the channel 156, and the channel buried film pattern 158. The semiconductor pattern may be formed by performing a selective epitaxial growth (SEG) process using a top surface of the substrate 100 as a seed. Accordingly, the semiconductor pattern may include polysilicon or single-crystal silicon. On the contrary, after an amorphous silicon film filling the lower portion of the channel hole 152 is formed, the semiconductor pattern may be formed by performing a laser epitaxial growth (LEG) process or a solid phase epitaxy (SPE) process on the amorphous silicon film. In this case, the dielectric film structure 154, the channel 156, and the channel buried film pattern 158 may be formed on a top surface of the semiconductor pattern.

A pad 160 and 160a that fills an upper portion of the channel hole 152 may be formed. In an exemplary process of forming the pad 160 and 160a, a recess may be formed by removing respective upper portions of the dielectric film structure 154, the channel 156, and the channel buried film pattern 158 through an etch-back process. Next, a pad film filling the recess may be formed on the channel buried film pattern 158, the channel 156, the dielectric film structure 154, and the uppermost interlayer insulating film pattern 130e, and the pad 160 and 160a may be formed by planarizing an upper portion of the pad film until a top surface of the uppermost interlayer insulating film pattern 130e is exposed. The pad film may be formed of polysilicon, for example, polysilicon doped with n-type impurity. On the contrary, after an auxiliary pad film is formed of amorphous silicon, the pad film may be formed by crystallizing the auxiliary pad film. The planarization process may include a CMP process.

Figure 12A:
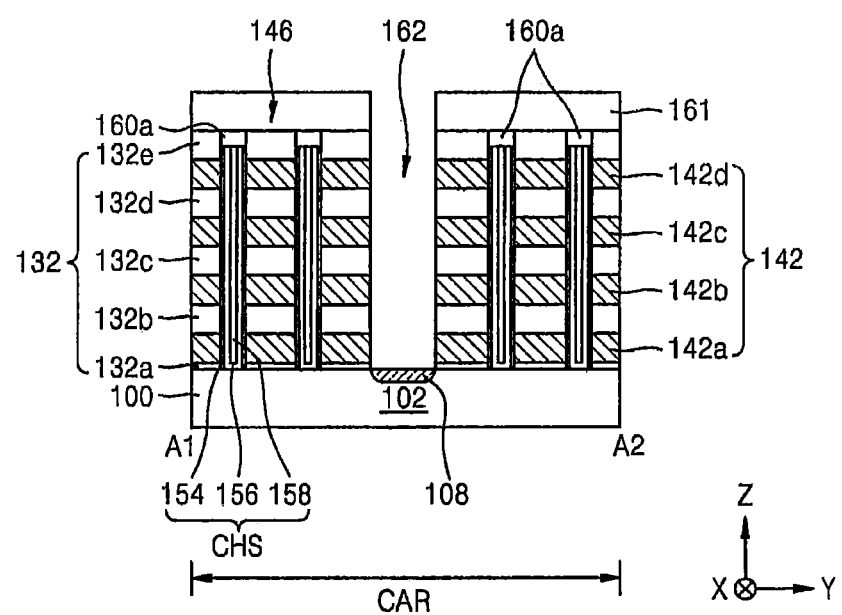
Figure 12B:
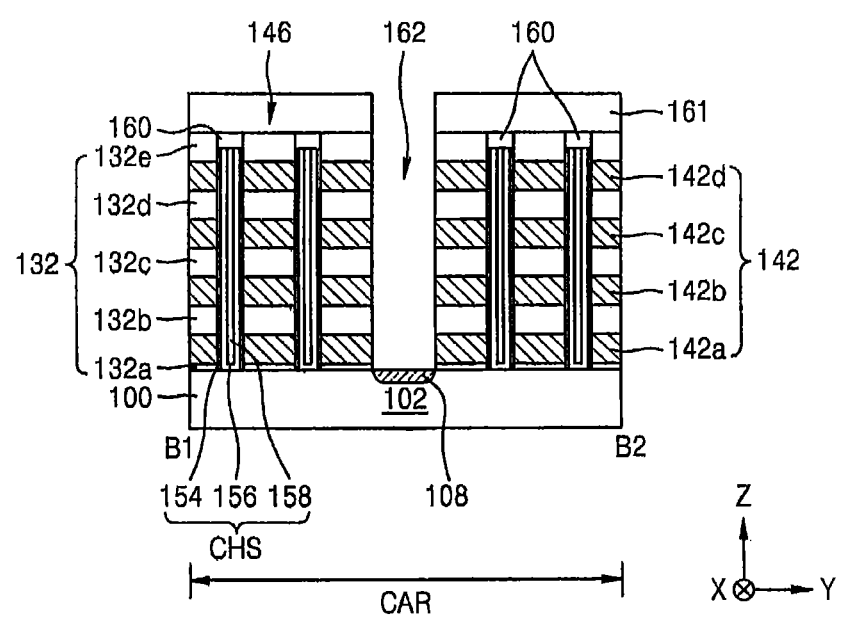
Figure 12C:
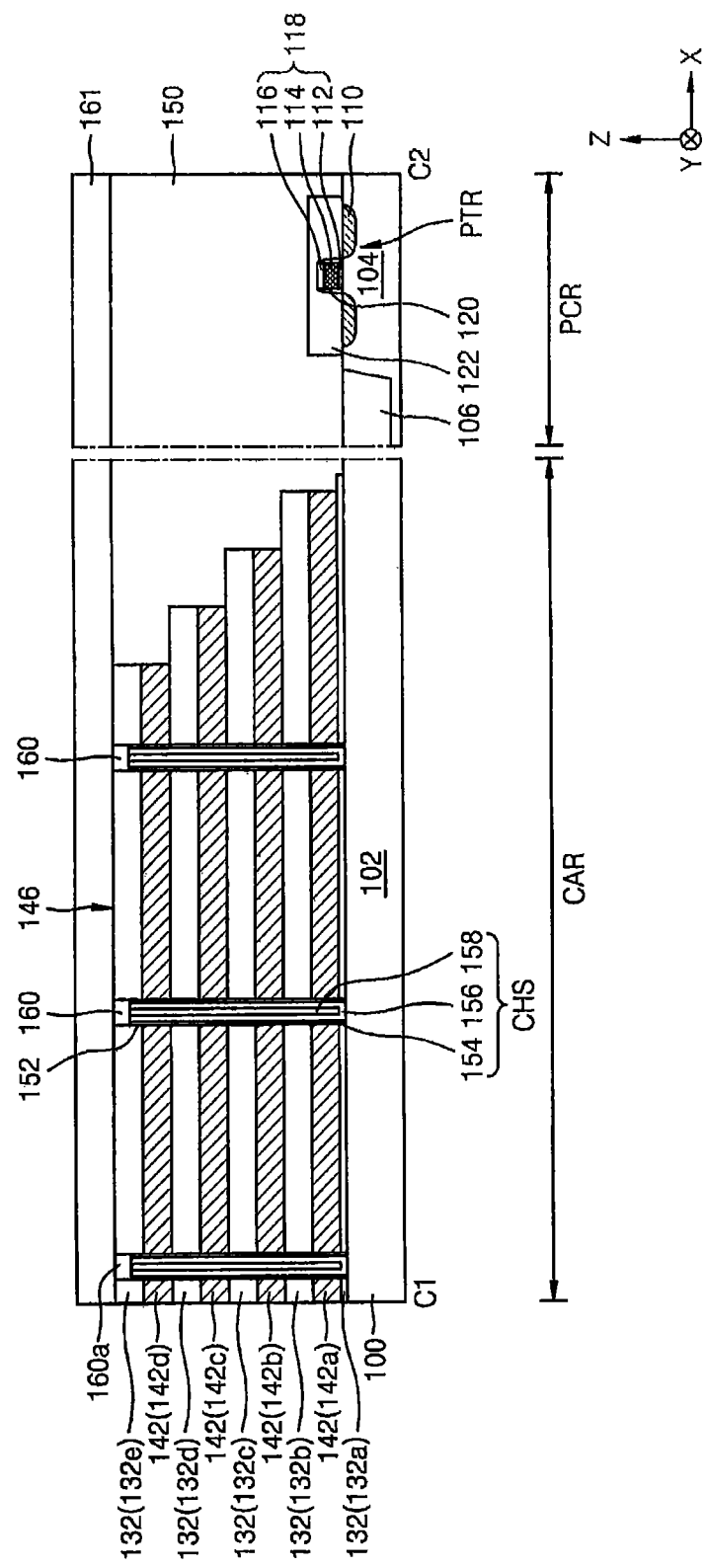

Referring to FIGS. 12A, 12B, and 12C, an insulative capping film 161 is formed on the mold structure 146 and the mold protection film 150. The insulative capping film 161 may contact a top surface of the pad 160 and 160a. An opening 162 for a common source line is formed by partially etching the insulative capping film 161 and the mold structure 146. The opening 162 for the common source line may pass through the insulative capping film 161 and the mold structure 146 between the channels 156 and extend in the first direction (Z direction).

In one embodiment, the opening 162 for the common source line may extend along the second direction (X direction) in the cell array region CAR of the substrate 100 and may be a trench shape. The mold structure 146 may be cut by the opening 162 for the common source line. Accordingly, a predetermined number of the channels 156 may be defined as a unit or may be grouped.

For example, after a hard mask (not shown) is formed on the insulative capping film 161, the opening 162 for the common source line may be formed by etching the insulative capping film 161, the interlayer insulating films 130 and the sacrificial films 140 of the step-shaped mold structure 146 through a dry etching process using the hard mask as an etching mask. After the opening 162 for the common source line is formed, a top surface of the substrate 100 may be exposed through the opening 162 for the common source line. The hard mask may be formed of, for example, a silicon-based or a carbon-based spin-on-hard mask (SOH) material or a photoresist material. After the opening 162 for the common source line is formed, the hard mask may be removed through an ashing process and/or a strip process.

An impurity implantation process may be performed so as to form a first impurity region 108 into an upper portion of the substrate 100 exposed by the opening 162 for the common source line. For example, the impurity implantation process may be performed by implanting an n-type impurity such as phosphorus (P) or arsenic (As). The first impurity region 108 may extend in the second direction (X direction) and may be provided as the common source line CSL.

On the other hand, as the opening 162 for the common source line is formed, the interlayer insulating films 130 and the sacrificial films 140 may be respectively converted into interlayer insulating film patterns 132a, 132b, 132c, 132d, and 132e, and sacrificial film patterns 142 (142a, 142b, 142c, and 142d). The interlayer insulating film patterns 132a, 132b, 132c, 132d, and 132e may constitute an interlayer insulating film pattern structure 132. At this time, the respective interlayer insulating film patterns 132a, 132b, 132c, 132d, and 132e and the respective sacrificial film patterns 142a, 142b, 142c, and 142d may extend in the second direction (X direction). The first impurity region 108 that is formed into the upper portion of the substrate 100 of the cell array region CAR may be exposed through the opening 162 for the common source line, and respective sidewalls of the interlayer insulating film patterns 132a, 132b, 132c, 132d, and 132e and the sacrificial film patterns 142a, 142b, 142c, and 142d may be exposed through the opening 162 for the common source line.

Figure 13A:
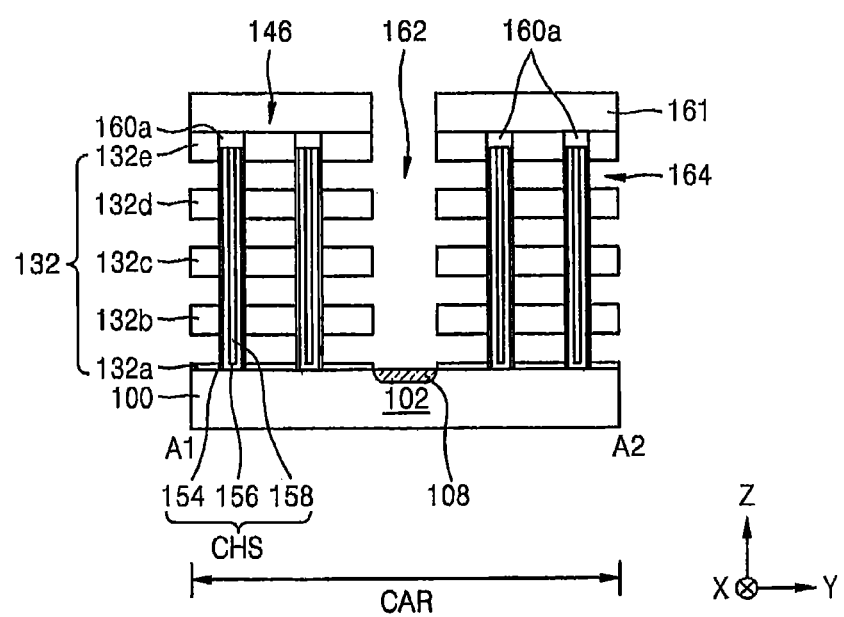
Figure 13B:
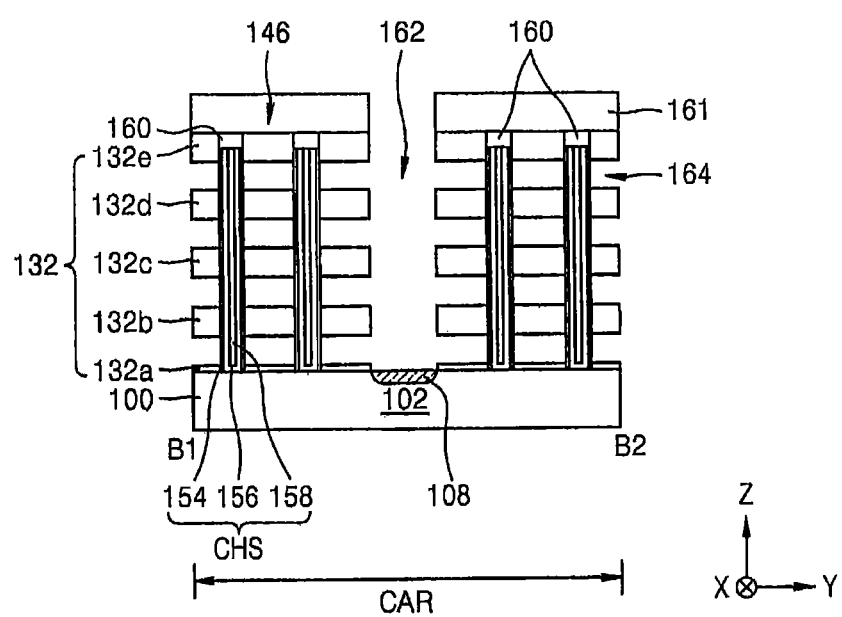
Figure 13C:
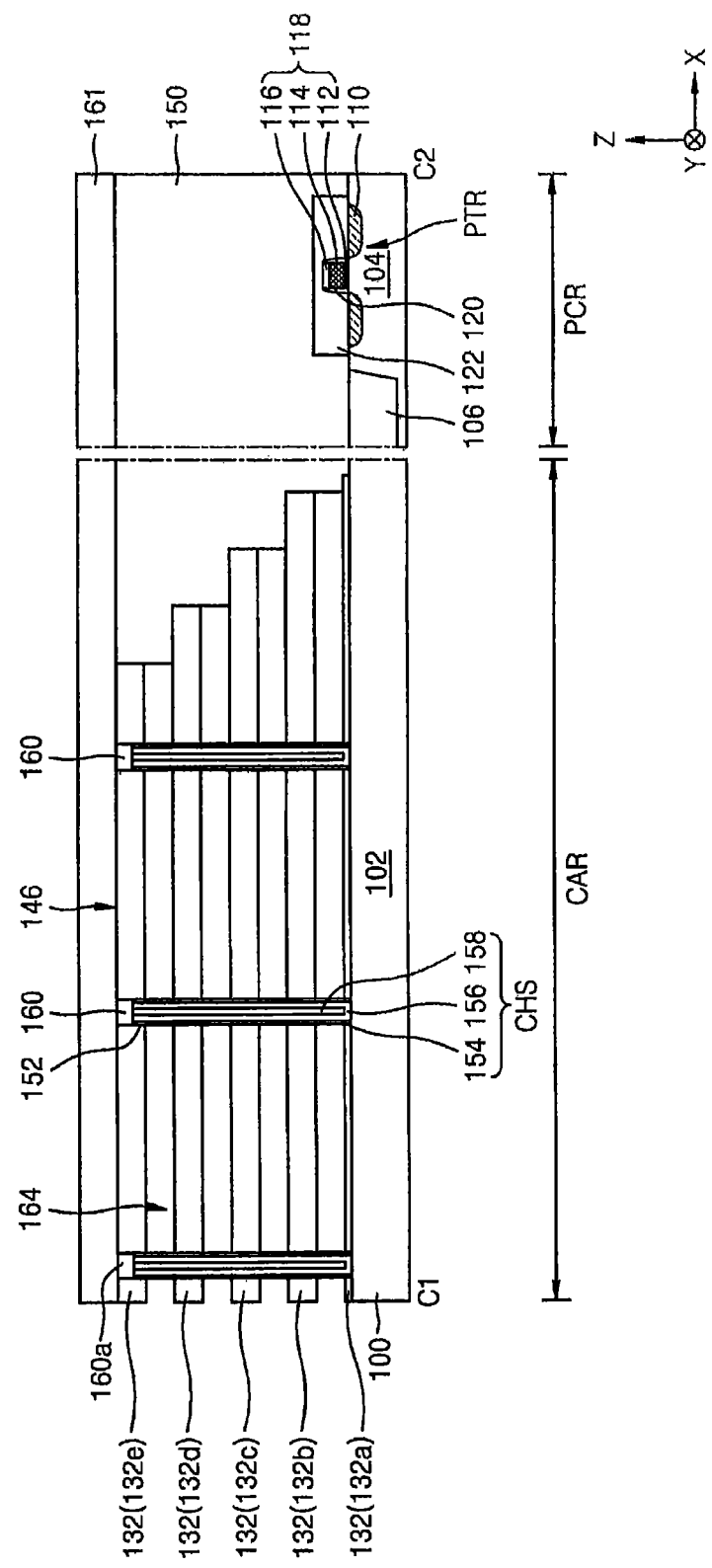

Referring to FIGS. 13A, 13B, and 13C, the sacrificial film patterns 142a, 142b, 142c, and 142d having the sidewalls exposed by the opening 162 for the common source line, are removed. The sacrificial film patterns 142a, 142b, 142c, and 142d may be removed by a wet etching process using an etching solution through the exposed sidewalls. For example, Examples of the etching solution may include an acid solution, such as a phosphoric acid solution or a sulfuric acid solution.

When the sacrificial film patterns 142a, 142b, 142c, and 142d are removed, space regions 164 are formed between the respective interlayer insulating film patterns 132a, 132b, 132c, 132d, and 132e, and an outer sidewall of the dielectric film structure 154 may be partially exposed by the space regions 164.

Figure 14A:
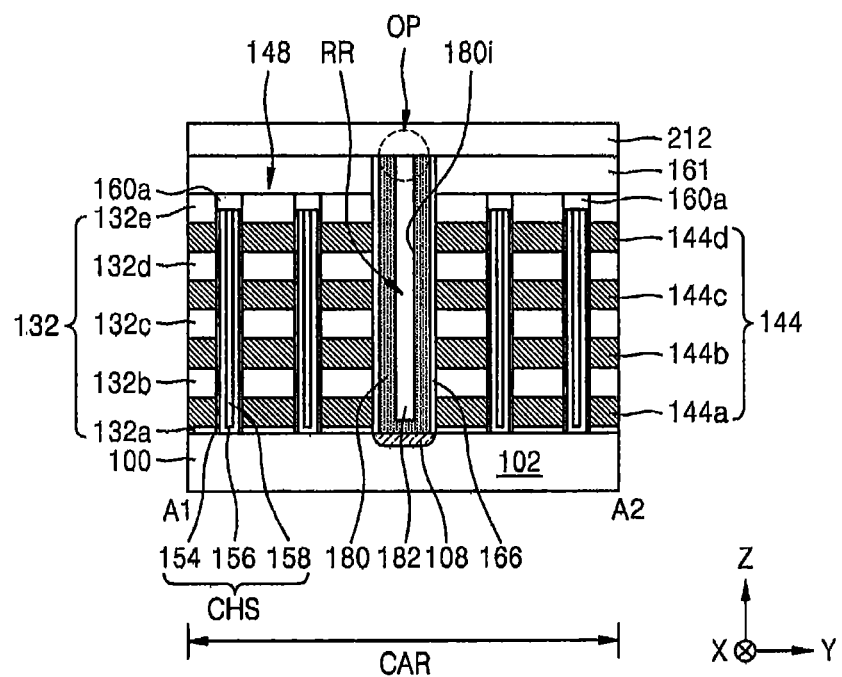
Figure 14B:
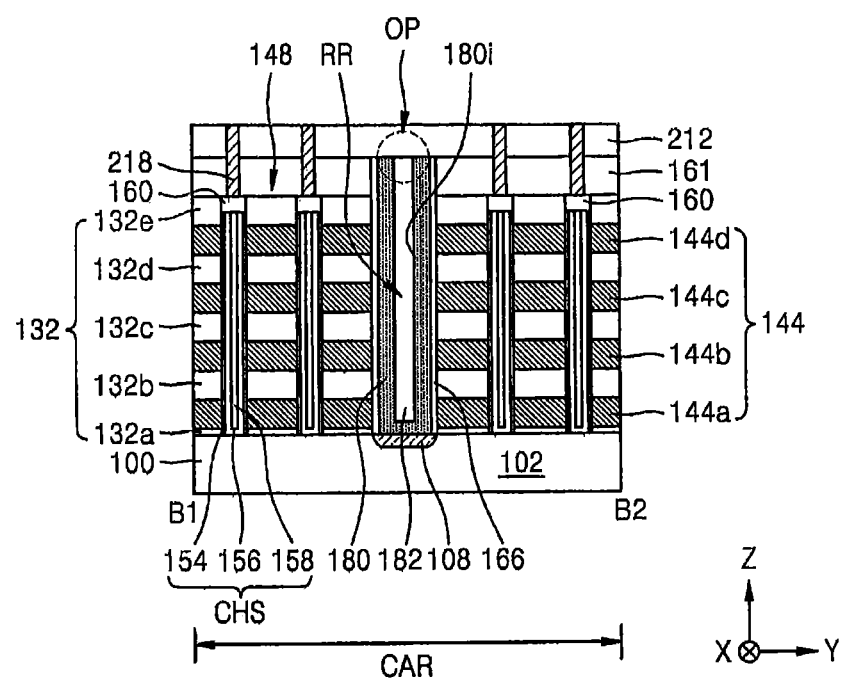
Figure 14C:
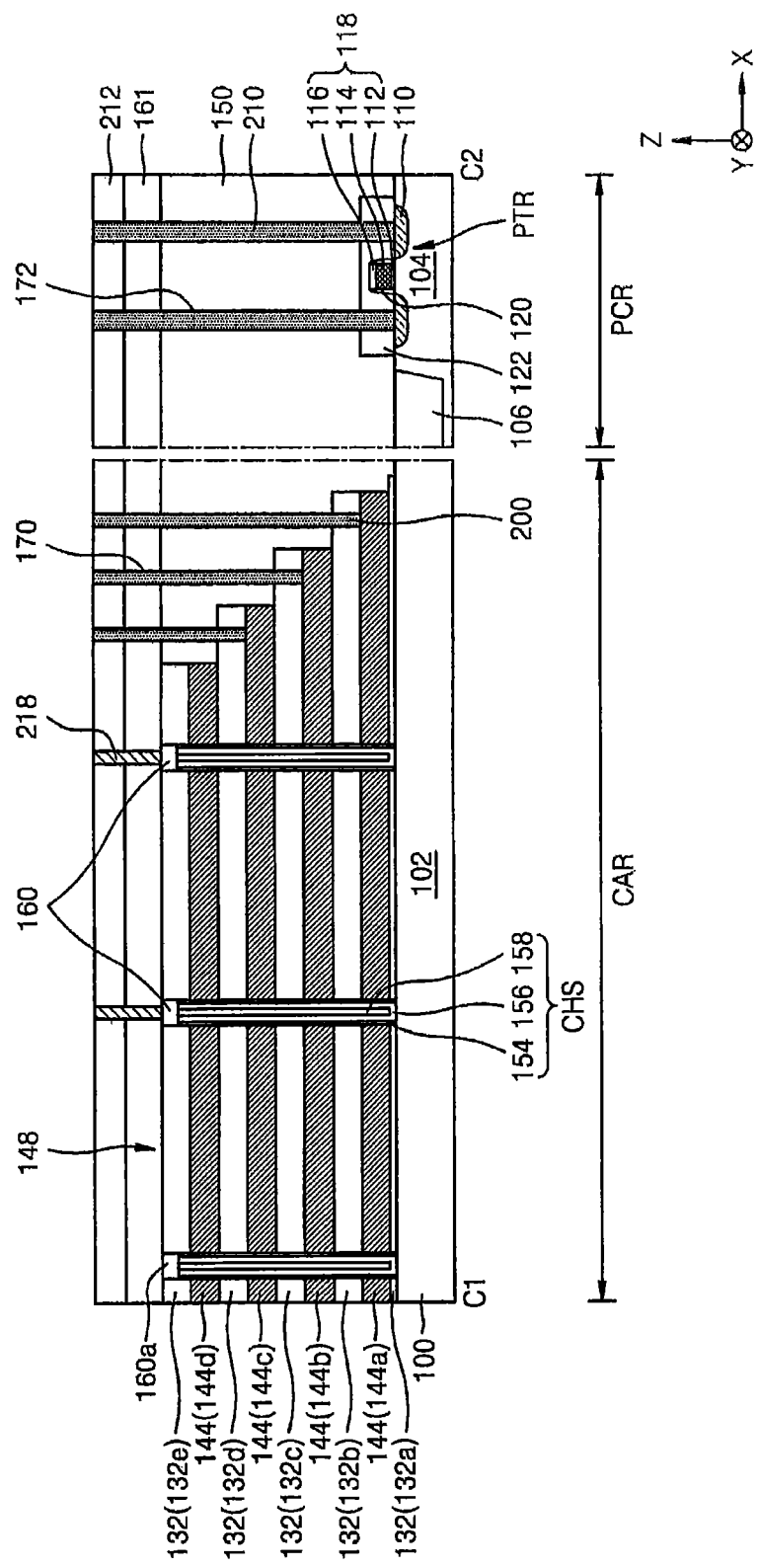

Referring to FIGS. 14A, 14B, and 14C, cell gate lines 144a, 144b, 144c, and 144d may be respectively formed in the space regions 164. Accordingly, the sacrificial film patterns 142a, 142b, 142c, and 142d may be replaced with cell gate line structures 144. Each of the cell gate line structures 144 may include a plurality of cell gate lines 144a, 144b, 144c, and 144d. In this case, the cell gate lines 144a, 144b, 144c, and 144d may contact the exposed outer sidewall of the dielectric film structure 154. Therefore, the cell gate lines 144a, 144b, 144c, and 144d may be formed to surround the outer sidewall of the dielectric film structure 154 and the channel 156 while extending in the second direction (X direction). Consequently, a cell gate stack structure 148 that includes the interlayer insulating film pattern structure 132 and the cell gate line structure 144 may be formed.

In one embodiment, prior to forming the cell gate lines 144a, 144b, 144c, and 144d, an additional blocking film (not shown) may be further formed of silicon oxide or a metal oxide along inner sidewalls of the space regions 164 and surfaces of the interlayer insulating film patterns 132a, 132b, 132c, 132d, and 132e.

A separation film pattern 166 may be formed on a sidewall of the opening 162 for the common source line so as to cover the respective sidewalls of the cell gate lines 144a, 144b, 144c, and 144d and the interlayer insulating film patterns 132a, 132b, 132c, 132d, and 132e exposed through the opening 162 for the common source line. The separation film pattern 166 may be formed of an insulating material, such as silicon oxide.

In one embodiment, after the separation film pattern 166 is formed, an impurity implantation process may be additionally performed at the first impurity region 108 through the opening 162 for the common source line.

In one embodiment, a metal silicide pattern, such as a nickel silicide pattern or a cobalt silicide pattern, may be further formed on the first impurity region 108 so as to reduce resistance of the common source line CSL.

A first common source line contact plug 180 may be formed in the opening 162 for the common source line CSL so as to cover the first impurity region 108 that is exposed at a bottom surface of the opening 162 for the common source line CSL and the separation film pattern 166 that is exposed at the sidewall of the opening 162 for the common source line CSL. In one embodiment, the first common source line contact plug 180 may be formed to include an inner sidewall 180i delimiting a recessed region RR in the opening 162 for the common source line CSL. The first common source line contact plug 180 may further include an open passage of the recessed region RR in the vicinity of an entrance of the opening 162 for the common source line CSL.

The first common source line contact plug 180 may extend in the second direction (X direction).

An outer sidewall of the first common source line contact plug 180 may include a first part facing to the cell gate stack structure 148 including the cell gate lines 144a, 144b, 144c, and 144d, and a second part facing to the insulative capping film 161.

A bottom surface of the first common source line contact plug 180 facing to the first impurity region 108 may contact the first impurity region 108, and the outer sidewall of the first common source line contact plug 180 facing to the cell gate stack structure 148 and the insulative capping film 161 may contact a sidewall of the separation film pattern 166.

The first common source line contact plug 180 may be formed of a metal, a conductive metal nitride, doped polysilicon, or combinations thereof. For example, the first common source line contact plug 180 may include tungsten (W). In this case, a by-product gas, for example, hydrogen fluoride that is generated in the formation process of the contact plug 180 may remain in the recessed region RR.

After the first common source line contact plug 180 is formed, the by-product gas in the recessed region RR may be exhausted outside the recessed region RR through the open passage of the recessed region RR. In one embodiment, the by-product gas, such as hydrogen fluoride in the recessed region RR, may be exhausted by using a heat treatment process or a vacuum pumping process. For example, the heat treatment process may be performed at a temperature of approximately 600° C. higher than room temperature in a nitrogen atmosphere. The vacuum pumping process may be performed at room temperature. In one embodiment, the heat treatment process may be performed in-situ with the formation process of the first common source line contact plug 180.

A common source line buried film pattern 182 may be formed to extend in the second direction (X direction) in the recessed region RR.

A first upper insulating film 212 may be formed on the insulative capping film 161. The first upper insulating film 212 may be formed of an insulating material such as silicon oxide.

An auxiliary cell bit line contact 218 may be formed to pass through the first upper insulating film 212 and the insulative capping film 161 in the cell array region CAR and may contact the pad 160.

A plurality of cell gate line contact holes 170 that pass through the first upper insulating film 212, the insulative capping film 161, the mold protection film 150 and the interlayer insulating film patterns 132a, 132b, 132c, 132d, and 132e may be formed in the cell array region CAR. The cell gate line contact holes 170 may extend in the first direction (Z direction). The cell gate line contact holes 170 may be formed by partially etching the first upper insulating film 212, the insulative capping film 161, the mold protection film 150 and the interlayer insulating film patterns 132a, 132b, 132c, 132d, and 132e in the cell array region CAR so as to expose a portion of the respective cell gate lines 144a, 144b, 144c, and 144d.

For example, after forming a hard mask (not shown) on the first upper insulating film 212, the cell gate line contact holes 170 may be formed by etching the first upper insulating film 212, the insulative capping film 161, the mold protection film 150, and the interlayer insulating film patterns 132a, 132b, 132c, 132d, and 132e through a dry etching process using the hard mask as an etching mask. For example, the hard mask may be formed of a silicon-based or a carbon-based spin-on-hard mask material or a photoresist material. After the cell gate line contact holes 170 are formed, the hard mask may be removed through an ashing process and/or a strip process.

Among the cell gate line contact holes 170, a cell gate line contact hole that exposes the uppermost cell gate line 144d is not illustrated in FIG. 14C for convenience, but the cell gate line contact holes 170 may include the cell gate line contact hole that exposes the uppermost cell gate line 144d.

Peripheral circuit contact holes 172 may be formed by etching the first upper insulating film 212, the insulative capping film 161, the mold protection film 150 and the peripheral circuit protection film 122 in the peripheral circuit region PCR. For example, after a hard mask (not shown) is formed on the first upper insulating film 212, the peripheral circuit contact holes 172 may be formed by etching the first upper insulating film 212, the insulative capping film 161, the mold protection film 150 and the peripheral circuit protection film 122. For example, the hard mask may be formed of a silicon-based or a carbon-based spin-on-hard mask material or a photoresist material. After forming the peripheral circuit contact holes 172, the hard mask may be removed through an ashing process and/or a strip process.

The peripheral circuit contact holes 172 may be formed to pass through the first upper insulating film 212, the insulative capping film 161, the mold protection film 150, and the peripheral circuit protection film 122 while extending in the first direction (Z direction).

The peripheral circuit contact holes 172 may be formed to partially expose the second impurity region 110 that is formed in the upper portion of the second active area 104 of the substrate 100 in the peripheral circuit region PCR.

In one embodiment, the cell gate line contact holes 170 and the peripheral circuit contact holes 172 may be formed substantially simultaneously. In one embodiment, the cell gate line contact holes 170 and the peripheral circuit contact holes 172 may not be formed at the same time.

A plurality of cell gate line contact plug 200 may be formed in the respective cell gate line contact holes 170, and a plurality of peripheral circuit contact plugs 210 may be formed in the respective peripheral circuit contact holes 172.

The cell gate line contact plugs 200 may pass through the first upper insulating film 212, the insulative capping film 161, the mold protection film 150, and the interlayer insulating film patterns 132a, 132b, 132c, 132d, and 132e and may contact the respective cell gate lines 132a, 132b, 132c, 132d, and 132e.

The peripheral circuit contact plug 210 may pass through the first upper insulating film 212, the insulative capping film 161, the mold protection film 150, and the peripheral circuit protection film 122 and may contact the second impurity region 110.

In one embodiment, the cell gate line contact plug 200 and the peripheral circuit contact plug 210 may be formed substantially simultaneously. An exemplary process for simultaneously forming the cell gate line contact plug 200 and the peripheral circuit contact plug 210 may include forming a conductive film filling in the holes 170 and 172 on the substrate 100 and planarizing the conductive film through a CMP process and/or an etch-back process to expose a top surface of the first upper insulating film 212. The conductive film may be formed of a conductive material, such as a metal, a conductive metal nitride, or doped polysilicon through a CVD process, an ALD process, or a sputtering process.

Top surfaces of the cell gate line contact plug 200 and the peripheral circuit contact plug 210 may be positioned on a substantially same plane.

In one embodiment, the auxiliary cell bit line contact 218, the cell gate line contact plug 200, and the peripheral circuit contact plug 210 may be formed substantially simultaneously. Top surfaces of the auxiliary cell bit line contact 218, the cell gate line contact plug 200, and the peripheral circuit contact plug 210 may be positioned on a substantially same plane.

After that, as illustrated in FIGS. 2, 3A, 3B, and 3C, an auxiliary cell bit line 220 that contacts the auxiliary cell bit line contact 218 may be formed on the first upper insulating film 212. A plurality of cell gate line contact wirings 214 that are electrically connected to the respective cell gate line contact plugs 200 may be formed on the first upper insulating film 212. In addition, a peripheral circuit contact wiring 216 that is electrically connected to the peripheral circuit contact plug 210 may be formed on the first upper insulating film 212.

A second upper insulating film 226 may be formed on the first upper insulating film 212 and may cover the auxiliary cell bit line 220, the cell gate line contact wiring 214, and the peripheral circuit contact wiring 216.

A common source bit line contact 232 that is electrically connected to the first common source line contact plug 180 may be formed by passing through the second upper insulating film 226 and the first upper insulating film 212. A common source bit line 234 that is electrically connected to the common source bit line contact 232 may be formed on the second upper insulating film 226.

A cell bit line contact 228 that contacts the auxiliary cell bit line 220 may be formed by passing through the second upper insulating film 226, and a cell bit line 230 that is electrically connected to the cell bit line contact 228 may be formed on the second upper insulating film 226.

A first connection contact 222 that is in contact with the cell gate line contact wiring 214 by passing through the second upper insulating film 226, and a second connection contact 223 that is in contact with the peripheral circuit contact wiring 216 by passing through the second upper insulating film 226 may be formed. A connection wiring 224 that connects the first connection contact 222 and the second connection contact 223 may be formed on the second upper insulating film 226.

Top surfaces of the cell bit line 230, the common source bit line 234, and the connection wiring 224 may be positioned on a substantially same plane.

According to further example embodiments of the inventive concept, as illustrated in FIGS. 4A and 4B, a common source bit line contact hole CT may be formed by partially removing the second upper insulating film 226, the first upper insulating film 212, and the common source line buried film pattern 182. An inner sidewall 180i of the first common source line contact plug 180 may be exposed by the common source bit line contact hole CT (see FIGS. 14A and 14B).

The common source bit line contact 232 that is electrically connected to the first common source line contact plug 180 may be formed in the common source bit line contact hole CT. The common source bit line contact 232 may contact the top surface and the inner sidewall 180i of the first common source line contact plug 180 and may contact the top surface of the common source line buried film pattern 182.

The common source bit line 234 that is electrically connected to the common source bit line contact 232 may be formed on the second upper insulating film 226.

According to further example embodiments of the inventive concept, as illustrated in FIGS. 5A and 5B, the common source line buried film pattern 182a that partially exposes the inner sidewall 180i of the first common source line contact plug 180 may be formed by partially removing the common source line buried film pattern 182. The second common source line contact plug 180a that contacts the exposed inner sidewall 180i of the first common source line contact plug 180 may be formed on the common source line buried film pattern 182a. The second common source line contact plug 180a may be formed to extend in the second direction (X direction).

Next, the first upper insulating film 212 and the second upper insulating film 226 may be sequentially formed on the insulative capping film 161. The common source bit line contact 232a that is electrically connected to the first common source line contact plug 180 and the second common source line contact plug 180a may be formed to pass through the second upper insulating film 226 and the first upper insulating film 212. The second common source line contact plug 180a may be formed so as to be in contact with an upper portion of the inner sidewall 180i of the first common source line contact plug 180 and the top surface of the common source line buried film pattern 182a. The top surface of the second common source line contact plug 180a may be positioned on substantially the same plane as the top surface of the first common source line contact plug 180. The common source bit line contact 232a may be formed so as to contact the top surfaces of the first common source line contact plug 180 and the second common source line contact plug 180a. The common source bit line 234 that is electrically connected to the common source bit line contact 232a may be formed on the second upper insulating film 226.

According to further example embodiments of the inventive concept, as illustrated in FIGS. 6A and 6B, the barrier film pattern 184 may be formed on the inner sidewall 180i of the first common source line contact plug 180 delimiting the recessed region RR. In this case, the common source line buried film pattern 182 of FIGS. 14A and 14B may not be formed in the recessed region RR. The barrier film pattern 184 may be formed to extend in the second direction (X direction). The second common source line contact plug 180*b* that fills in the recessed region RR and extends in the second direction (X direction) may be formed on the barrier film pattern 184.

Next, the first upper insulating film 212 and the second upper insulating film 226 may be sequentially formed on the insulative capping layer 161. The common source bit line contact 232*b* that is electrically connected to the first common source line contact plug 180 and the second common source line contact plug 180*b* may be formed by passing through the second upper insulating film 226 and the first upper insulating film 212. The common source bit line contact 232*b* may be formed so as to contact the top surfaces of the first common source line contact plug 180, the barrier film pattern 184, and the second common source line contact plug 180*b*. The common source bit line 234 that is electrically connected to the common source bit line contact 232*b* may be formed on the second upper insulating film 226.

According to further example embodiments of the inventive concept, referring to FIGS. 14A, 14B, and 14C, the first upper insulating film 212 may be formed on the insulative capping film 161. The plurality of cell gate line contact holes 170 that expose the respective cell gate lines 144*a*, 144*b*, 144*c*, and 144*d* may be formed by passing through the first upper insulating film 212, the insulative capping film 161, the mold protection film 150, and the plurality of interlayer insulating film patterns 132*a*, 132*b*, 132*c*, 132*d*, and 132*e* in the cell array region CAR. The cell gate line contact plugs 200 may be formed in the cell gate line contact holes 170, respectively. The second upper insulating film 226 may be formed on the first upper insulating film 212. The peripheral circuit contact holes 172 that pass through the second upper insulating film 226, the first upper insulating film 212, the insulative capping film 161, and the mold protection film 150 and extend in the first direction (Z direction) may be formed in the peripheral circuit region PCR. The peripheral circuit contact plugs 210 may be formed in the peripheral circuit contact holes 172, respectively.

These embodiments may be implemented in combination with example embodiments described with reference to FIGS. 4A and 4B, 5A and 5B, or 6A and 6B.

According to further example embodiments of the inventive concept, a method of manufacturing a vertical memory device may be the same as the method of manufacturing the vertical memory device according to example embodiments described with reference to FIGS. 8A through 14C, except that the forming of the insulative capping film 161 is omitted. It will be more specifically described as follows.

Referring to FIGS. 7A, 7B, 7C, 8A through 14C, the insulative capping film 161 illustrated in FIGS. 12A, 12B, and 12C may not be formed on the mold structure 146 and the mold protection film 150. The first upper insulating film 212 and the second upper insulating film 226 may be sequentially formed on the mold structure 146 and the mold protection film 150. Therefore, the opening 162 for the common source line may be formed to pass through the mold structure 146.

For example, to form the opening 162 for the common source line, prior to forming the first upper insulating film 212 on the mold structure 146, a hard mask (not shown) may be formed on the mold structure 146, and the mold structure 146 may be etched through a dry etching process using the hard mask as an etching mask. After the opening 162 for the common source line is formed, the top surface of the substrate 100 may be exposed through the opening 162 for the common source line.

For example, the hard mask may be formed of a silicon-based or a carbon-based spin-on-hard mask material or a photoresist material.

After the opening 162 for the common source line is formed, the hard mask may be removed through an ashing process and/or a strip process.

The first common source line contact plug 180 may be formed to cover the bottom surface and the sidewall of the opening 162 for the common source line and may be formed to have the inner sidewall 180*i* delimiting the recessed region RR in the opening 162 for the common source line.

In addition, the plurality of cell gate line contact holes 170 that expose the respective cell gate lines 144*a*, 144*b*, 144*c*, and 144*d* may be formed to pass through the mold protection film 150 and the plurality of interlayer insulating film patterns 132*a*, 132*b*, 132*c*, 132*d*, and 132*e* in the cell array region CAR.

For example, after forming a hard mask (not shown) on the mold protection film 150, the plurality of cell gate line contact holes 170 may be formed by etching the mold protection film 150 and the plurality of interlayer insulating film patterns 132*a*, 132*b*, 132*c*, 132*d*, and 132*e* through a dry etching process using the hard mask as an etching mask. After the cell gate line contact holes 170 are formed, the respective cell gate lines 144*a*, 144*b*, 144*c*, and 144*d* may be partially exposed through the cell gate line contact holes 170.

For example, the hard mask may be formed of a silicon-based or a carbon-based spin-on-hard mask material and a photoresist material.

After the cell gate line contact holes 170 are formed, the hard mask may be removed through an ashing process and/or a strip process.

The peripheral circuit contact holes 172 that pass through the mold protection film 150 and the peripheral circuit protection film 122 and extend in the first direction (Z direction) may be formed in the peripheral circuit region PCR.

For example, after a hard mask (not shown) is formed on the mold protection film 150, the peripheral circuit contact holes 172 may be formed by etching the mold protection film 150 and the peripheral circuit protection film 122 through a dry etching process using the hard mask as an etching mask. After the peripheral circuit contact holes 172 are formed, the second impurity region 110 of the second active area 104 of the peripheral circuit region PCR may be partially exposed through the peripheral circuit contact holes 172.

For example, the hard mask may be formed of a silicon-based or a carbon-based spin-on-hard mask material or a photoresist material. After the peripheral circuit contact holes 172 are formed, the hard mask may be removed through an ashing process and/or a strip process.

The cell gate line contact plugs 200 may be formed in the cell gate line contact holes 170, respectively. The peripheral circuit contact plugs 210 may be formed in the peripheral circuit contact holes 172, respectively. The cell gate line contact plug 200 and the peripheral circuit contact plug 210 may be formed at substantially the same time. The first common source line contact plug 180 may be formed at substantially the same time as the cell gate line contact plug 200 and the peripheral circuit contact plug 210.

The auxiliary cell bit line contact 218 may pass through the first upper insulating film 212 and may be electrically connected to the pad 160.

The cell gate line contact wiring 214 that is electrically connected to the cell gate line contact plug 200 may be formed on the mold protection film 150.

The peripheral circuit contact wiring 216 that is electrically connected to the peripheral circuit contact plug 210 may be formed on the mold protection film 150. The first connection contact 222 that passes through the first upper insulating film 212 and contacts the cell gate line contact wiring 214 may be formed. The second connection contact 223 that passes through the first upper insulating film 212 and contacts the peripheral circuit contact wiring 216 may be formed. The connection wiring 224 that connects the first connection contact 222 and the second connection contact 223 may be formed on the first upper insulating film 212.

These embodiments may be implemented in combination with example embodiments described with reference to FIGS. 4A and 4B, 5A and 5B, or 6A and 6B.

Figure 15:
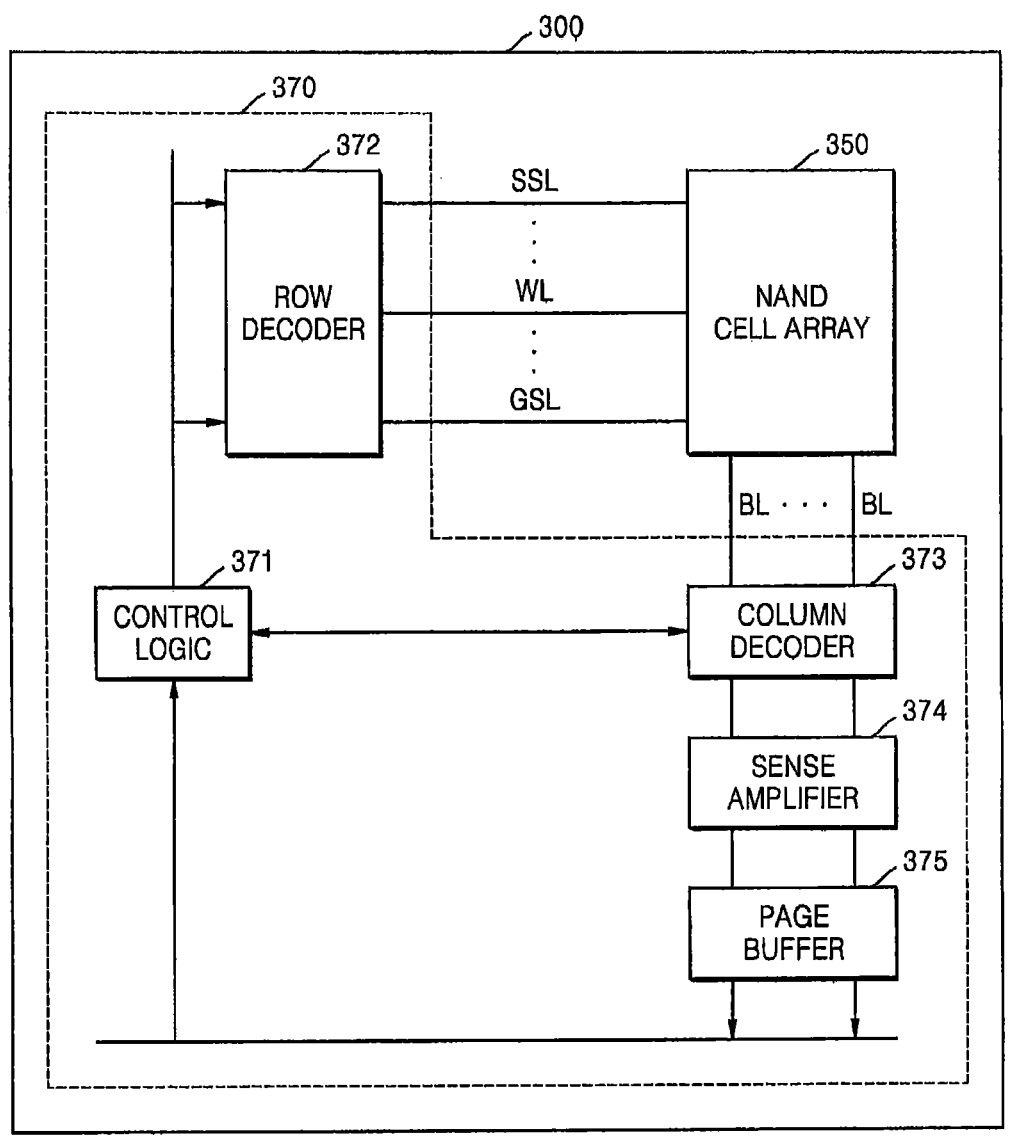

FIG. 15 is a schematic block diagram of a vertical memory device, according to example embodiments of the inventive concept.

Referring to FIG. 15, in the vertical memory device 300, a NAND cell array 350 of vertically stacked structure may be connected to a core circuit unit 370. For example, the NAND cell array 350 may include any one of the vertical memory devices according to example embodiments of the inventive concept. The core circuit unit 370 may include e.g., a control logic 371, a row decoder 372, a column decoder 373, a sense amplifier 374, and a page buffer 375.

The control logic 371 may communicate with the row decoder 372, the column decoder 373, and the page buffer 375. The row decoder 372 may communicate with the NAND cell array 350 via a plurality of cell string selection lines SSL, a plurality of word lines WL, and a plurality of ground selection lines GSL. The column decoder 373 may communicate with the NAND cell array 350 via a plurality of bit lines BL. The sense amplifier 374 may be connected to the column decoder 373 when a signal is output from the NAND cell array 350, and may not be connected to the column decoder 373 when a signal is transferred to the NAND cell array 350.

For example, the control logic 371 may transmit a row address signal to the row decoder 372, and the row decoder 372 may decode the row address signal and transmit the same to the NAND cell array 350 via the string selection lines SSL, the word lines WL, and ground selection lines GSL. The control logic 371 may transmit a column address signal to the column decoder 373 or the page buffer 375, and the column decoder 373 may decode the column address signal and transmit the same to the NAND cell array 350 via the plurality of bit lines BL. A signal of the NAND cell array 350 may be transmitted to the sense amplifier 374 via the column decoder 373, may be amplified by the sense amplifier 374, and then, may be transmitted to the control logic 371 through the page buffer 375.

Figure 16:
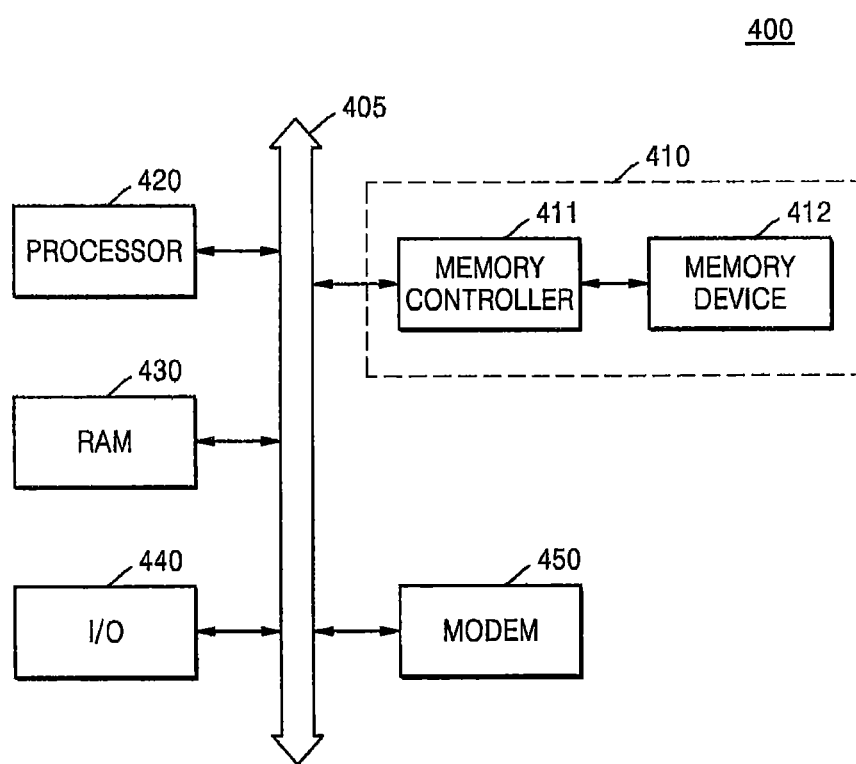

FIG. 16 is a block diagram illustrating a schematic configuration of an electronic system according to example embodiments of the inventive concept.

Referring to FIG. 16, the electronic system 400 may include a memory system 410, a processor 420, a random access memory (RAM) 430, an input/output device 440, and a modem 450, such as a baseband chipset, each of which is electrically connected to a system bus 405. The memory system 410 may include a memory controller 411 and a memory device 412. The RAM 430 may be used as a working memory of the processor 420. The input/output device 440 may communicate with the bus 405. The memory device 412 may include the vertical memory device, which has been described above with reference to FIGS. 1 through 14C, according to example embodiments of the inventive concept. The vertical memory device may include a plurality of vertical memory devices, each of which may include a plurality of memory transistors that are connected in series and are vertically arranged. Therefore, data processed in the processor 420 or high-capacity data input from the outside may be stably stored. The memory controller 411 is configured to control the memory device 412. The memory system 410 may be provided as a memory card or a semiconductor disk device, such as a solid state disk (SSD), by a combination of the memory device 412 and the memory controller 411. The processor 420 may communicate with the memory system 410 through the bus 405. In a case where the electronic system 400 is a mobile device, a battery (not illustrated) may be further provided so as to supply an operating voltage of the electronic system 400. Although not illustrated, the electronic system 400 according to example embodiments may further include an application chipset, a camera image processor (CIP), and a mobile DRAM.

The methods of manufacturing the vertical memory device according to example embodiments removes a by-product gas that is confined in an interior of the common source line contact plug. Therefore, it is possible to prevent or reduce the likelihood of an electrical short between the common source line contact plug and the cell gate lines and a swelling of the common source line contact plug. Furthermore, it is possible to implement a high-reliability vertical memory device from which a defect of the common source line contact plug is removed.

While the inventive concept has been particularly shown and described with reference to example embodiments thereof, it will be understood that various changes in form and details may be made therein without departing from the spirit and scope of the following claims.

What is claimed is:

1. A vertical memory device comprising:
   a cell gate stack structure on a substrate, the cell gate stack structure comprising a plurality of cell gate lines spaced apart from one another in a vertical direction, and an opening adjacent to the plurality of cell gate lines, the opening passing through the cell gate stack structure;
   a contact plug in the opening, the contact plug comprising an inner sidewall delimiting a recessed region in the opening;
   a buried film pattern in a portion of the recessed region, the buried film pattern being formed of a Si-containing material;
   a contact overlying the buried film pattern, the contact comprising an inner contact portion disposed in the recessed region; and
   a separation film pattern interposed between the plurality of cell gate lines and the contact plug,
   wherein the contact plug comprises a conductive metal nitride, and
   wherein the inner contact portion of the contact is in contact with the buried film pattern within the recessed region.

2. The vertical memory device of claim 1, wherein the contact plug comprises a first top surface farthest from the substrate, and wherein the buried film pattern comprises a second top surface farthest from the substrate, the second top surface being closer to the substrate than the first top surface.

3. The vertical memory device of claim 1, wherein the contact plug has an inner top surface delimiting a lowermost portion of the recessed region, the inner top surface being higher than a top surface of the substrate.

4. The vertical memory device of claim 1, wherein the inner contact portion of the contact is in contact with the inner sidewall of the contact plug.

5. The vertical memory device of claim 1, wherein the contact plug has a bottom portion interposed between the substrate and the buried film pattern, the bottom portion being in contact with the buried film pattern within the recessed region.

6. The vertical memory device of claim 1, wherein the separation film pattern comprises an insulating material.

7. The vertical memory device of claim 1, wherein a vertical cross-sectional shape of the contact plug is a U-shape.

8. The vertical memory device of claim 1, wherein the contact further comprises an outer contact portion outside the recessed region,
wherein a first width of the outer contact portion is greater than a second width of the inner contact portion.

9. The vertical memory device of claim 1, further comprising at least one vertical channel structure extending in the vertical direction through the plurality of cell gate lines,
wherein portions of the plurality of cell gate lines and a portion of the separation film are interposed between the at least one vertical channel structure and the contact plug.

10. A vertical memory device comprising:
a plurality of first cell gate lines spaced apart from one another in a vertical direction on a substrate;
a plurality of second cell gate lines spaced apart from one another in the vertical direction on the substrate, the plurality of second cell gate lines being laterally spaced apart from the plurality of first cell gate lines;
a contact plug interposed between the plurality of first cell gate lines and the plurality of second cell gate lines, the contact plug comprising an inner sidewall delimiting a recessed region;
a buried film pattern in a portion of the recessed region, the buried film pattern being formed of a Si-containing material;
a contact overlying the buried film pattern, the contact comprising an inner contact portion disposed in the recessed region; and
a separation film pattern having a first insulating portion interposed between the plurality of first cell gate lines and the contact plug, and a second insulating portion interposed between the plurality of second cell gate lines and the contact plug,
wherein the inner contact portion of the contact has a sidewall in contact with the inner sidewall of the contact plug, and
wherein a bottom surface of the inner contact portion is in contact with a top surface of the buried film pattern within the recessed region.

11. The vertical memory device of claim 10, wherein a first vertical length from the substrate to a first top of the contact plug is greater than a second vertical length from the substrate to a second top of the buried film pattern.

12. The vertical memory device of claim 10, wherein the contact plug has a bottom portion contacting a bottom surface of the buried film pattern, an interface between the bottom portion of the contact plug and the bottom surface of the buried film pattern being higher than a top surface of the substrate.

13. The vertical memory device of claim 10, further comprising:
a first vertical channel structure extending in the vertical direction through the plurality of first cell gate lines; and
a second vertical channel structure extending in the vertical direction through the plurality of second cell gate lines,
wherein the contact plug, the buried film pattern, and the separation film pattern are interposed between the first vertical channel structure and the second vertical channel structure.

14. A vertical memory device comprising:
a plurality of cell gate lines spaced apart from one another in a vertical direction on a substrate;
a contact plug having an inner sidewall delimiting a recessed region and an outer sidewall facing the plurality of cell gate lines;
a buried film pattern in a lower portion of the recessed region, the buried film pattern being formed of a Si-containing material having a resistance greater than a resistance of the contact plug;
a contact overlying the buried film pattern, the contact comprising an inner contact portion disposed in the recessed region; and
a separation film pattern interposed between the plurality of cell gate lines and outer sidewall of the contact plug,
wherein a first length of the contact plug in the vertical direction is greater than a second length of the buried film pattern in the vertical direction.

15. The vertical memory device of claim 14, wherein the inner contact portion of the contact has a sidewall in contact with the inner sidewall of the contact plug within the recessed region.

* * * * *